United States Patent [19]
Ema et al.

[11] Patent Number: 5,641,979
[45] Date of Patent: Jun. 24, 1997

[54] SEMICONDUCTOR MEMORY DEVICE HAVING ELECTRICALLY ERASABLE PROGRAMMABLE READ ONLY MEMORY AND DYNAMIC RANDOM ACCESS MEMORY FUNCTIONS AND METHOD OF WRITING, READING AND ERASING INFORMATION THEREFOR

[75] Inventors: Taiji Ema, Kawasaki; Tatsuya Kajita, Inagi, both of Japan

[73] Assignee: Fujitsu Limited, Kawasaki, Japan

[21] Appl. No.: 176,688

[22] Filed: Jan. 3, 1994

Related U.S. Application Data

[63] Continuation of Ser. No. 665,893, Mar. 5, 1991, abandoned.

[30] Foreign Application Priority Data

Mar. 6, 1990 [JP] Japan ......... 2-54400

[51] Int. Cl.$^6$ ............ H01L 29/68; H01L 29/78
[52] U.S. Cl. ............ 257/312; 257/314; 257/316; 257/320; 257/906
[58] Field of Search ............ 357/23.6; 365/149, 365/145, 191, 185; 257/370, 298, 295, 296, 312, 314, 315, 316, 318, 319, 320, 322, 905, 906, 907, 908

[56] References Cited

U.S. PATENT DOCUMENTS

| | | | |
|---|---|---|---|
| 3,678,473 | 7/1972 | Wahlstrom | 365/149 |
| 3,852,800 | 12/1974 | Ohwada et al. | 365/149 |
| 3,859,642 | 1/1975 | Mar | 365/149 |
| 3,916,390 | 10/1975 | Chang et al. | 257/298 |
| 4,224,635 | 9/1980 | Mauthe | 257/298 |
| 4,543,594 | 9/1985 | Mohsen et al. | 357/23.6 |
| 4,615,020 | 9/1986 | Rinerson et al. | 365/185 |
| 4,811,290 | 3/1989 | Watanabe | 365/149 |
| 4,866,493 | 9/1989 | Arima et al. | 357/23.6 |
| 4,907,046 | 3/1990 | Ohji et al. | 357/23.6 |
| 4,958,318 | 9/1990 | Harari | 357/23.6 |
| 4,980,859 | 12/1990 | Guterman et al. | 365/185 |
| 4,984,206 | 1/1991 | Komatsu et al. | 365/149 |
| 4,991,139 | 2/1991 | Takahashi | 365/149 |
| 5,005,103 | 4/1991 | Kwon et al. | 257/296 |
| 5,020,030 | 5/1991 | Huber | 365/185 |
| 5,029,128 | 7/1991 | Toda | 365/145 |
| 5,043,946 | 8/1991 | Yamauchi et al. | 365/185 |
| 5,063,425 | 11/1991 | Yamauchi et al. | 257/298 |
| 5,065,201 | 11/1991 | Yamauchi | 257/298 |

*Primary Examiner*—Donald L. Monin, Jr.
*Attorney, Agent, or Firm*—Staas & Halsey

[57] ABSTRACT

A memory cell includes a transfer transistor having a gate which is connected to a word line, a first electrode which is connected to a bit line, and a second electrode, and a storage capacitor having a storage electrode which is connected to the second electrode of the transfer transistor, a confronting electrode, and a charge storage layer which is provided between the storage electrode and the confronting electrode. The storage capacitor has a capacitance which changes with a hysteresis curve which is determined by a bias voltage applied across the storage electrode and the confronting electrode, so that the capacitance takes one of two values depending on the bias voltage.

43 Claims, 29 Drawing Sheets

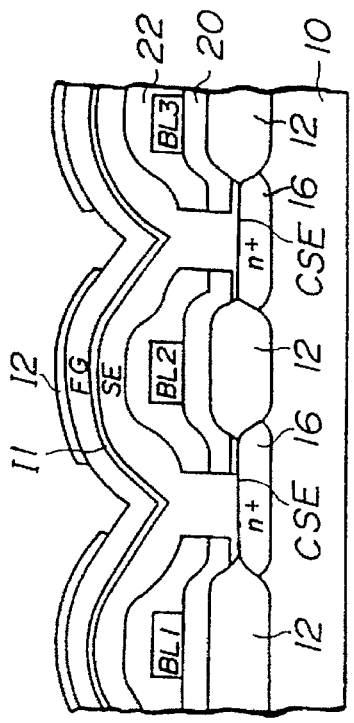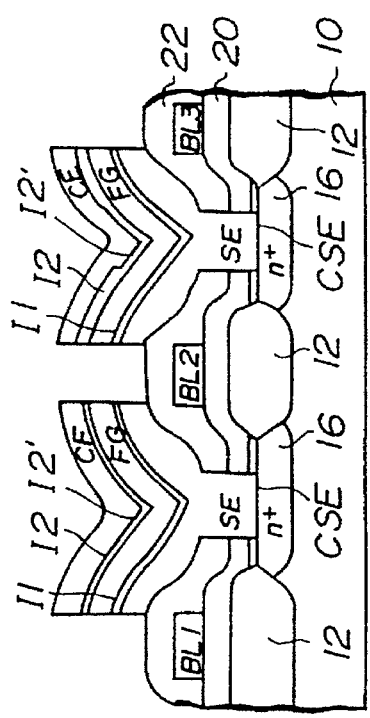
FIG.12F  FIG.12G
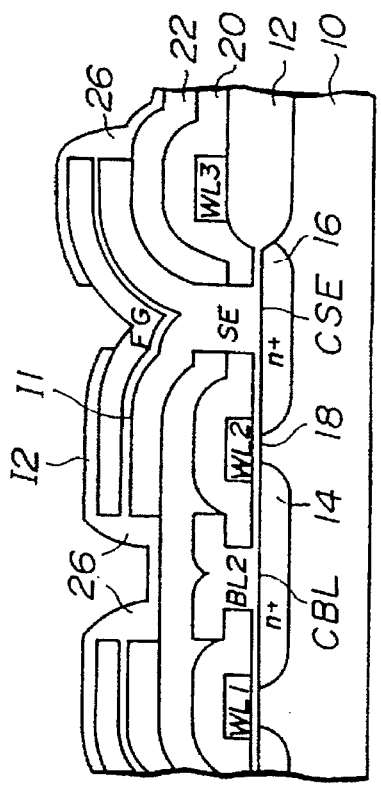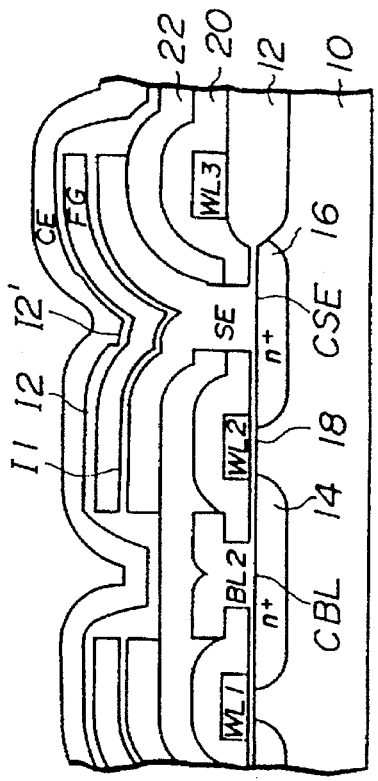

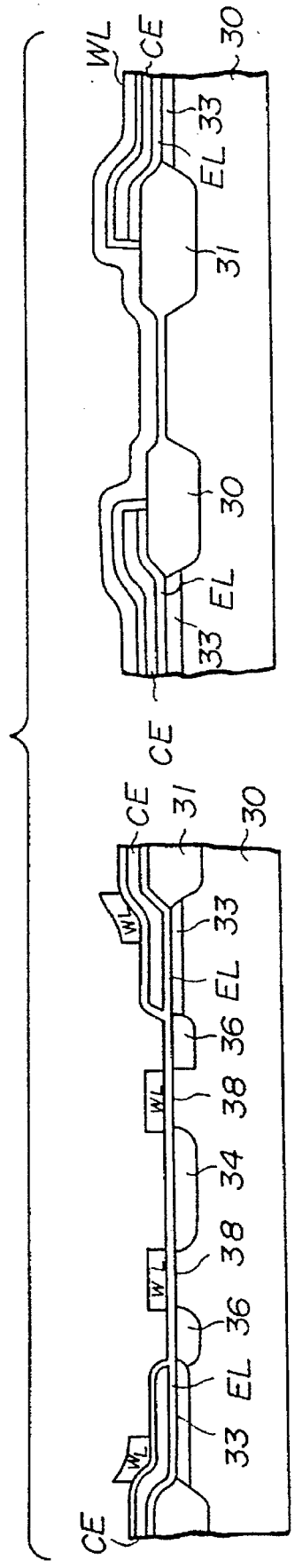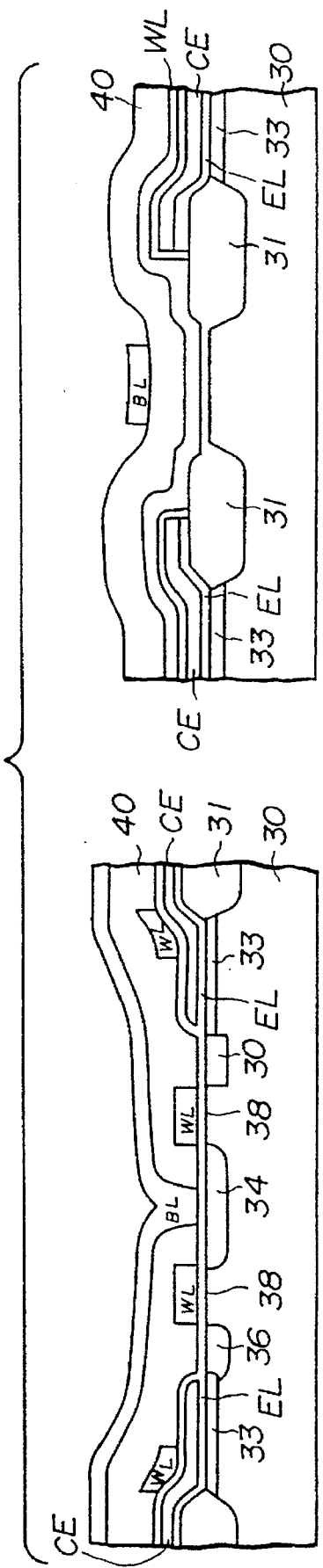
FIG.16D
FIG.16E

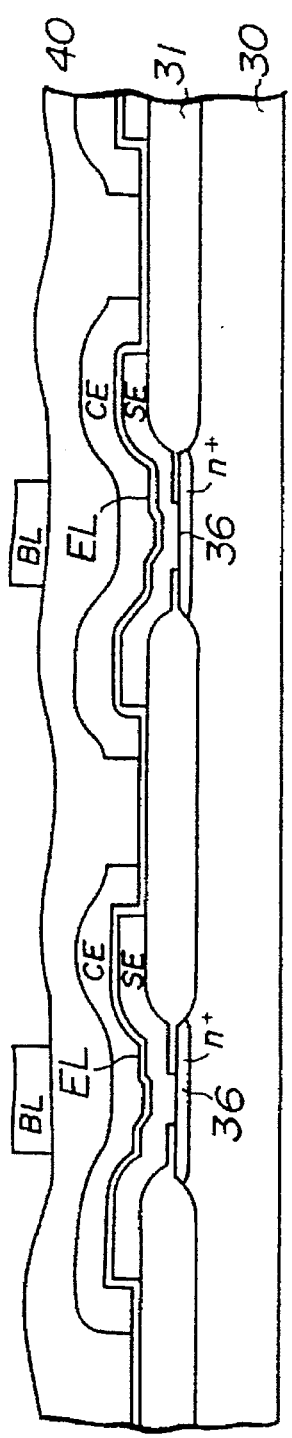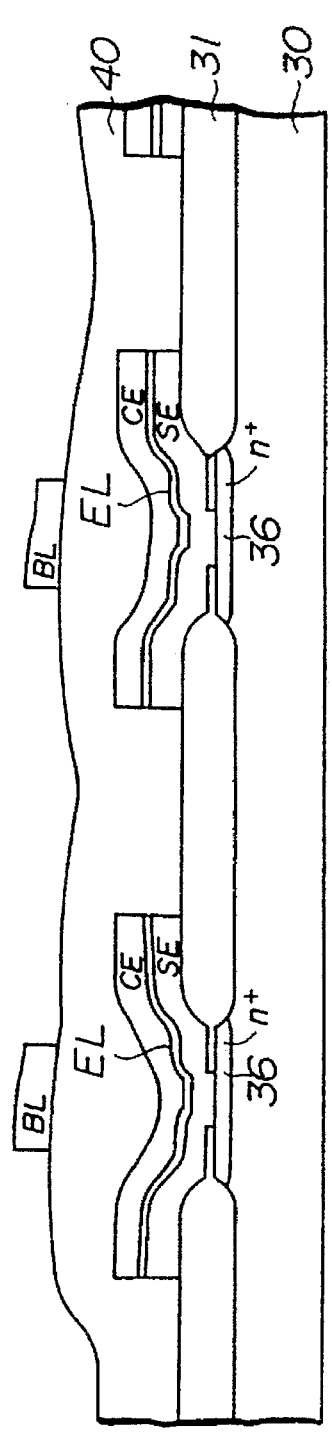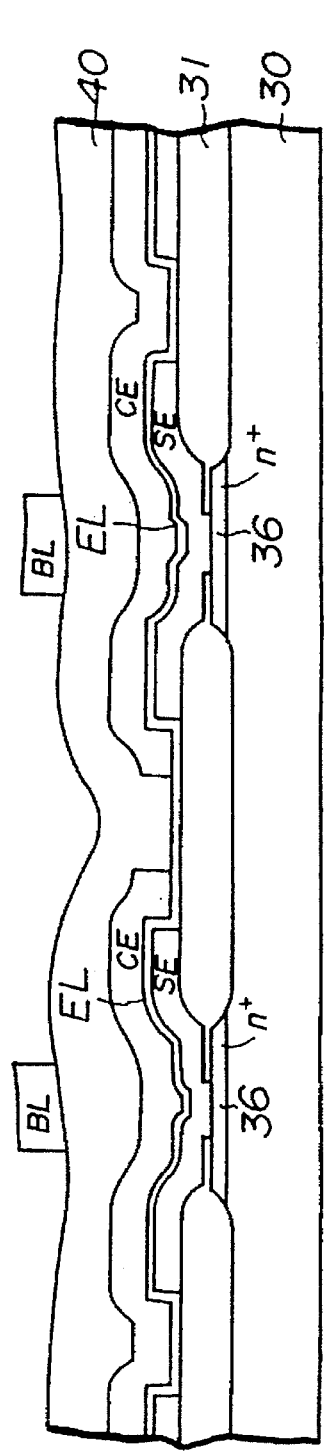

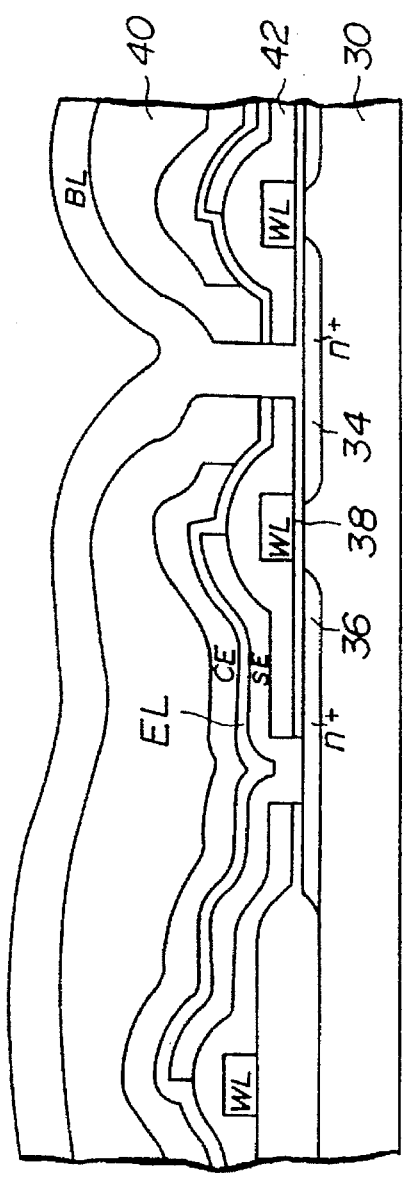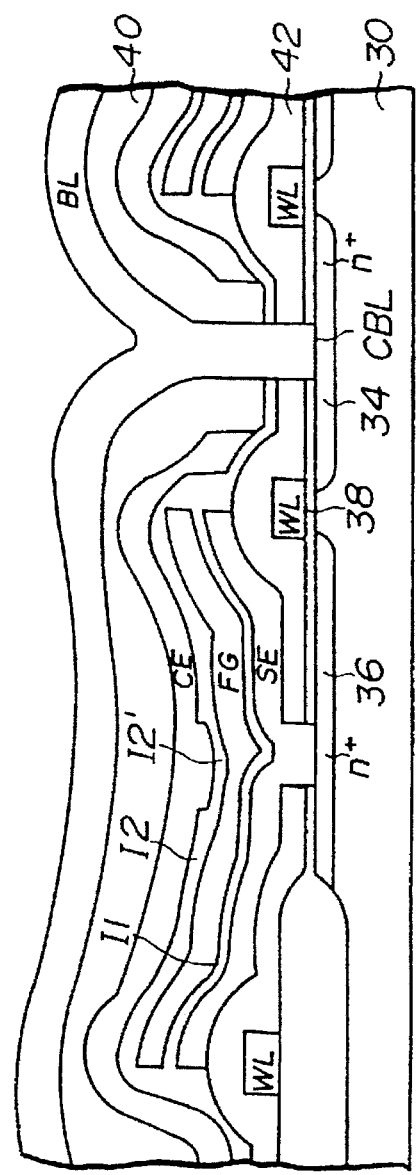

5,641,979

SEMICONDUCTOR MEMORY DEVICE HAVING ELECTRICALLY ERASABLE PROGRAMMABLE READ ONLY MEMORY AND DYNAMIC RANDOM ACCESS MEMORY FUNCTIONS AND METHOD OF WRITING, READING AND ERASING INFORMATION THEREFOR

This application is a continuation of application Ser. No. 07/665,893, filed Mar. 5, 1991, now abandoned.

BACKGROUND OF THE INVENTION

The present invention generally relates to semiconductor memory devices, and more particularly to a semiconductor memory device having an electrically erasable programmable read only memory (EEPROM) function and a dynamic random access memory (DRAM) function. The present invention also provides a method of writing, reading and erasing information in such a semiconductor memory device.

The EEPROM is known as a non-volatile memory which is electrically erasable and programmable. In the EEPROM, a memory cell is made up of at least two transistors, that is, a selection transistor and a storage transistor. For this reason, it is difficult to reduce the area occupied by the memory cells. In addition, the information is read out from the memory cell of the EEPROM by a current detection, thereby making a high-speed read operation difficult.

Therefore, in the conventional EEPROM, there are problems in that it is difficult to improve the integration density by reducing the area occupied by the memory cells, and that it is difficult to read stored information from the memory cell at a high speed.

On the other hand, there is a proposal to use a ferroelectric layer as a dielectric layer of a storage capacitor of the DRAM to realize a non-volatile memory utilizing a hysteresis characteristic of the ferroelectric layer. However, an inexpensive and ferroelectric material having a uniform characteristic is yet to be found, and in addition, it is difficult to insert the process of forming the ferroelectric layer between the existing processes of producing the semiconductor memory device.

Hence, there is a demand to realize a semiconductor memory device which can realize the ROM function by obtaining the hysteresis characteristic without the use of a special material and also realize the RAM function. Consequently, a method of writing, reading and erasing information in such a semiconductor memory device is likewise required.

SUMMARY OF THE INVENTION

Accordingly, it is a general object of the present invention to provide a novel and useful semiconductor memory device in which the problems described above are eliminated and the demand described above is satisfied.

Another and more specific object of the present invention is to provide a memory cell which is connected to a word line and a bit line, comprising a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode, where the storage capacitor has a capacitance which changes with a hysteresis curve which is determined by a bias voltage applied across the storage electrode and the confronting electrode, so that the capacitance takes one of two values depending on the bias voltage. According to the memory cell of the present invention, the hysteresis characteristic can be realized without the use of a special material, and the memory cell can function either as a memory cell of a ROM or a memory cell of a RAM.

Still another object of the present invention is to provide a semiconductor memory device comprising a plurality of word lines, a plurality of bit lines, a memory cell array including a plurality of memory cells respectively connected to one of the word lines and to one of the bit lines, a row decoder for selecting one of the word lines in response to an address signal, a column decoder for selecting one of the bit lines in response to the address signal, and a sense amplifier coupled to the bit lines for sensing and amplifying information on the bit lines, where each of the memory cells comprises a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode. The storage capacitor has a capacitance which changes with a hysteresis curve which is determined by a bias voltage applied across the storage electrode and the confronting electrode, so that the capacitance takes one of two values depending on the bias voltage.

A further object of the present invention is to provide a method of reading a volatile information stored in a memory cell which is connected to a word line and a bit line. The memory cell comprises a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode, where the storage capacitor has a capacitance which changes with a hysteresis curve which is determined by a bias voltage applied across the storage electrode and the confronting electrode, so that the capacitance takes one of two values depending on the bias voltage and the volatile information is stored in the storage capacitor. The method comprises the steps of precharging the bit line to a predetermined potential, and comparing the potential of the bit line with a reference potential when the transfer transistor is ON, so that the volatile information is read from the memory cell as a result of the comparison.

Another object of the present invention is to provide a method of reading a non-volatile information stored in a memory cell which is connected to a word line and a bit line. The memory cell comprises a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode, where the storage capacitor has a capacitance which changes with a hysteresis curve which is determined by a bias voltage applied across the storage electrode and the confronting electrode, so that the capacitance takes one of two values depending on the bias voltage and the non-volatile information is stored in the charge storage layer of the storage capacitor. The method comprises the steps of precharging the bit line to a predetermined potential, and injecting a predetermined charge into the charge storage layer of the storage capacitor and comparing the potential of the bit line with a reference potential when the transfer transistor is ON, so that the non-volatile information is read from the memory cell as a result of the comparison.

Still another object of the present invention is to provide a method of reading an information stored in a memory cell which is connected to a word line and a bit line. The memory cell comprises a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode, where the storage capacitor has a capacitance which changes with a hysteresis curve which is determined by a bias voltage applied across the storage electrode and the confronting electrode, so that the capacitance takes one of two values depending on the bias voltage. The method comprises the steps of precharging the bit line to a predetermined potential, comparing the potential of the bit line with a first reference potential when the transfer transistor is ON, so that a volatile information is read from the storage capacitor of the memory cell as a result of the comparison, and injecting a predetermined charge into the charge storage layer of the storage capacitor and comparing the potential of the bit line with a reference potential when the transfer transistor is ON, so that a non-volatile information is read from the charge storage layer of the storage capacitor the memory cell as a result of the comparison.

A further object of the present invention is to provide a method of writing/erasing an information stored in a memory cell which is connected to a word line and a bit line. The memory cell comprises a transfer transistor having a gate which is connected to the word line, a first electrode which is connected to the bit line, and a second electrode, and a storage capacitor having a storage electrode which is connected to the second electrode of the transfer transistor, a confronting electrode, and a charge storage layer which is provided between the storage electrode and the confronting electrode, where the storage capacitor has a capacitance which changes with a hysteresis curve which is determined by a bias voltage applied across the storage electrode and the confronting electrode, so that the capacitance takes one of two values depending on the bias voltage. The method comprises the steps of applying a first voltage to the confronting electrode, and applying a second voltage to the bit line to turn ON the transfer transistor when selectively writing a non-volatile information to the memory cell or erasing a non-volatile information stored in the memory cell.

Other objects and further features of the present invention will be apparent from the following detailed description when read in conjunction with the accompanying drawings.

BRIEF DESCRIPTION OF THE DRAWINGS

FIGS. 12A through 12G are cross sectional views for explaining a method of producing the first embodiment;

FIGS. 16A through 16E are cross sectional views for explaining a method of producing the second embodiment;

FIGS. 19A through 19C are cross sectional views for explaining a method of producing the third embodiment;

FIGS. 21A and 21B are cross sectional views showing an essential part of a fourth embodiment of the semiconductor memory device according to the present invention;

DESCRIPTION OF THE PREFERRED EMBODIMENTS

First, a description will be given of an operating principle of the present invention, by referring to FIGS. 1 through 8.

Figure 1A:
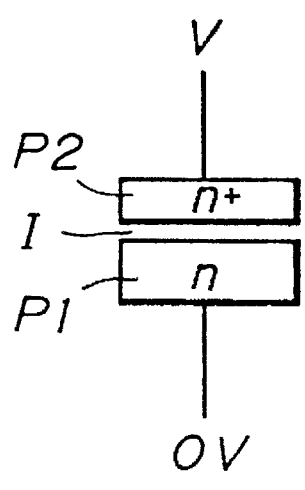
FIGS. 1A through 1C and FIGS. 2A through 2C are diagrams for explaining an operating principle of the present invention.

Operating Principle:

FIG. 1A shows a capacitor C which is used in the present invention. As shown, one electrode of the capacitor C is formed by an n-type polysilicon layer P1 and the other electrode of the capacitor C is formed by an $n^+$-type polysilicon layer P2, for example. The capacitor C is formed by sandwiching an insulator layer I between the polysilicon layers P1 and P2.

Figure 1B:
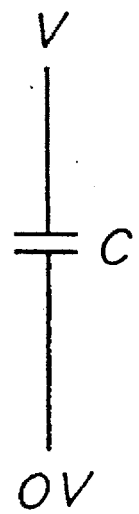

FIG. 1B shows an equivalent circuit of the capacitor C. The electrode formed by the n-type polysilicon layer P1 is connected to 0 [V], and the electrode formed by the $n^+$-type polysilicon layer P2 is connected to V [V] to apply a bias voltage V. When the impurity density of the n-type polysilicon layer P1 is high, the capacitance of the capacitor C (hereinafter referred to as the capacitance C) remains virtually unchanged even when the bias voltage V changes. However, when the impurity density of the n-type polysilicon layer P1 is low, the capacitance C changes depending on the bias voltage V. When the bias voltage V is set to a negative voltage, a depletion layer spreads within or extends into the n-type polysilicon layer P1, and the capacitance as a whole decreases due to the series connection of the capacitances formed by the depletion layer.

Figure 1C:
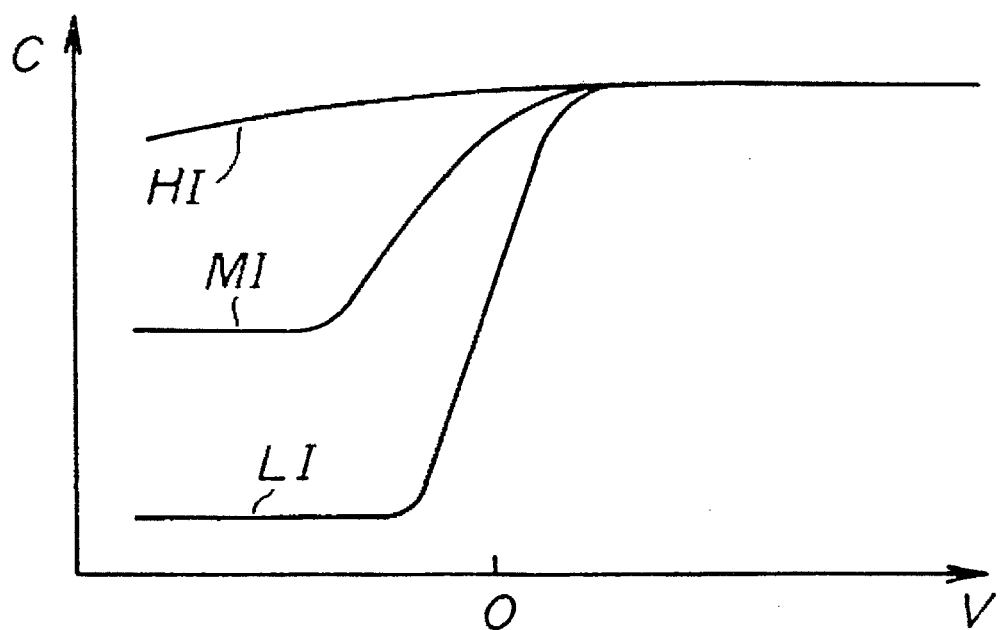

FIG. 1C is a graph showing a bias voltage V versus capacitance C characteristic. In FIG. 1C, HI indicates a characteristic obtained with a high impurity density of the n-type polysilicon layer P1, MI indicates a characteristic obtained with a medium impurity density of the n-type polysilicon layer P1, and LI indicates a characteristic obtained with a low impurity density of the n-type polysilicon layer P1.

When the bias voltage V is positive, no depletion layer is formed in the n-type polysilicon layer P1, and no change occurs in the capacitance C due to the impurity density of the n-type polysilicon layer P1. However, when the bias voltage V is negative, the depletion layer is formed in the n-type polysilicon layer P1. The thickness of the depletion layer increases as the impurity density of the n-type polysilicon layer P1 decreases, and the capacitance C as a whole decreases due to the decrease of the capacitances formed by the depletion layer. Hence, as shown in FIG. 1C, when the bias voltage V is negative, the capacitance C is smaller for smaller impurity densities of the n-type polysilicon layer P1. In other words, when the impurity density of the n-type polysilicon layer P1 is reduced, the capacitance C takes one of two values depending on the bias voltage V.

Figure 2A:
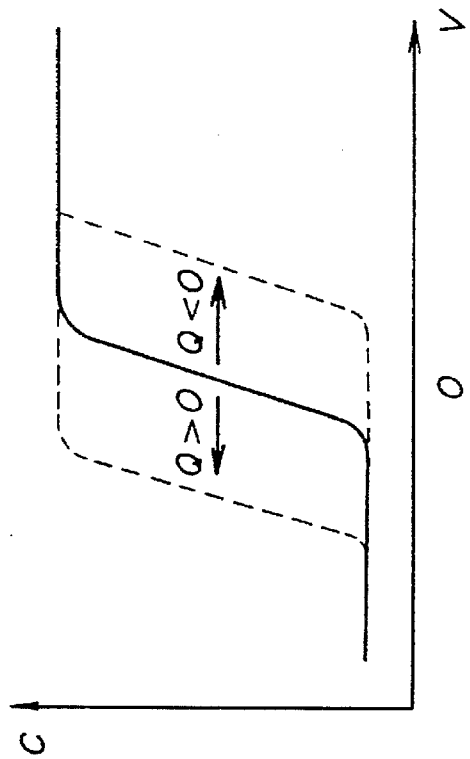
Figures 2B, 2C:
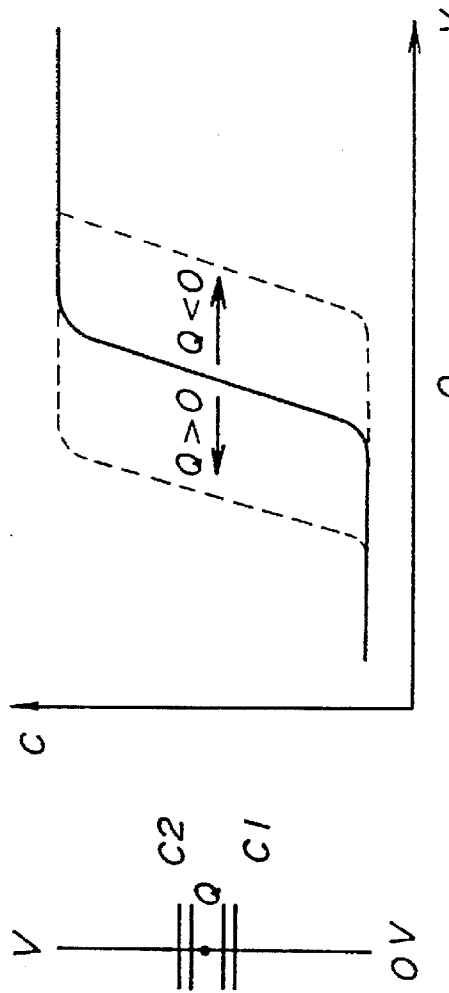

FIGS. 2A through 2C are diagrams for explaining the hysteresis characteristic of the capacitor C which is realized by the principle explained above in conjunction with FIGS. 1A through 1C. As shown in FIG. 2A, an $n^+$-type polysilicon layer P3 is inserted between the n-type polysilicon layer P1 and the $n^+$-type polysilicon layer P2, and a charge Q is stored in the polysilicon layer P3. A capacitor C1 is formed by sandwiching an insulator layer I1 between the polysilicon layers P1 and P3, and a capacitor C2 is formed by sandwiching an insulator layer I2 between the polysilicon layers P3 and P2. In other words, as shown in FIG. 2B, the capacitor C is formed by connecting the capacitors C1 and C2 in series with the charge Q inserted therebetween.

When the impurity density of the n-type polysilicon layer P1 is set low so that the capacitance C may take one of two values depending on the bias voltage V, the change of the capacitance C with respect to the bias voltage V shifts as shown in FIG. 2C depending on the charge Q which is stored in the polysilicon layer P3. That is, when the charge Q is positive, the depletion layer is less likely to be formed in the n-type polysilicon layer P1 and the characteristic shown in FIG. 2C shifts to the left as indicated by a dotted line. On the other hand, when the charge Q is negative, the depletion layer is more likely to be formed in the n-type polysilicon layer P1 and the characteristic shown in FIG. 2C shifts to the right as indicated by a dotted line. Accordingly, it is possible to realize the capacitor C which has the hysteresis characteristic.

Basic Structure:

A basic structure of a memory cell of a first embodiment of the semiconductor memory device according to the present invention will be described with reference to FIG. 3. This memory cell uses the capacitor C described above.

The memory cell is made up of a transfer transistor T and the storage capacitor C. A bit line BL is connected to a source of the transfer transistor T, and a word line WL is connected to a gate of the transfer transistor T. The storage capacitor C is connected to a drain of the transfer transistor T. The polysilicon layer P1 of the storage capacitor C functions as a storage electrode SE and is connected to the drain of the transfer transistor T. The polysilicon layer P2 of the storage capacitor C functions as a confronting electrode CE, and the polysilicon layer P3 functions as a floating gate FG and stores the charge Q. Hence, the capacitor C1 in which the depletion layer is formed is provided on the side of the transfer transistor T, while the capacitor C2 having the $n^+$-type polysilicon layer P2 is provided on the side of the confronting electrode CE.

In the above described memory cell, it is possible to change the capacitance C itself depending on the charge Q which is stored in the floating gate FG, as may be understood from FIG. 2C. That is, the memory cell has a special characteristic such that it is possible to vary the charge which is stored in the storage capacitor C by controlling the capacitance C by the charge Q.

Accordingly, by suitably controlling the special characteristic of the memory cell, it is possible to make the memory cell function as a memory cell of a RAM (DRAM) or a ROM. In other words, the memory cell may function as a memory cell of a RAM in which arbitrary RAM information (volatile information) can freely be written into the storage capacitor C and rewritten if needed. In addition, the memory cell may function as a memory cell of a ROM in which fixed ROM information (non-volatile information) is written by injecting the charge Q into the floating gate FG and reading the written ROM information.

In the storage capacitor C described above, the floating gate FG is used as a charge storage layer EL for storing the charge Q. However, it is of course possible to use as the charge storage layer EL a multi-layer structure having a trap characteristic for trapping a large charge. For example, a two-layer structure made up of $SiN/SiO_2$ layer and a three-layer structure made up of $SiO_2/SiN/SiO_2$ layer are examples of such a multi-layer structure.

First Basic Read Operation (Q>0/Q=0):

A description will now be given of a first basic read operation of the first embodiment, by referring to FIG. 4.

In this first basic read operation, the information "1" or "0" is stored as the ROM based on whether the charge Q injected into the floating gate FG is positive (Q>0) or zero (Q=0). A voltage Vc of the confronting electrode CE is set to 2.5 [V], and the charge is stored in the storage capacitor C to store information so that a potential Vs of the storage capacitor C on the side of the transfer transistor T becomes 0 [V] (low level) or 5 [V] (high level). The bias voltage V (=Vc−Vs) of the storage capacitor C takes one of two values, namely, −2.5 [V] and 2.5 [V]. In this case, the capacitance versus voltage characteristic becomes as shown in FIG. 4A.

Figure 4A:
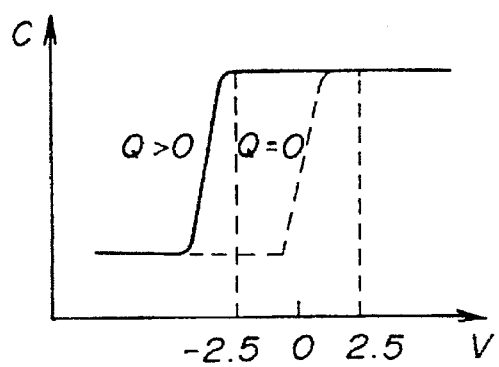
FIGS. 4A through 4G are diagrams for explaining a first basic read operation of the first embodiment.

In a state where the charge Q of the floating gate FG is positive as indicated by a solid line in FIG. 4A, the capacitance C always takes a large value when the bias voltage V falls within a range from −2.5 [V] to 2.5 [V]. On the other hand, in a state where the charge Q is zero as indicated by a dotted line in FIG. 4A, the capacitance C takes a small value when the bias voltage V is −2.5 [V] and takes a large value when the bias voltage V is 2.5 [V].

Basically, the read operation is carried out by setting the bit line BL which is precharged by a precharge means (not shown) to a floating state and turning the transfer transistor T ON by setting the word line to 5 [V] (WLon), so that the stored information is read out based on a potential change which occurs on the bit line BL. The control of the read operation depends on a potential Vb1 to which the bit line BL is precharged.

Figure 4B:
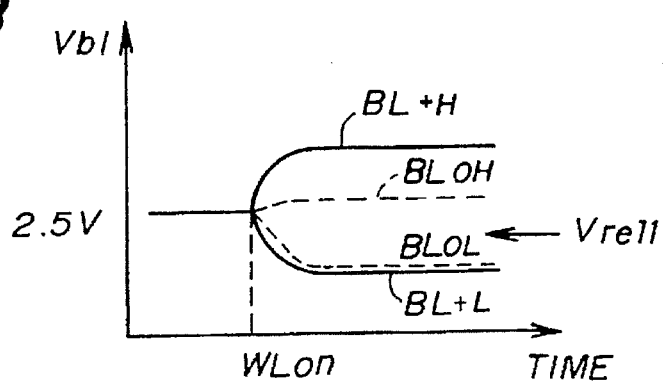

When Precharge Potential Vb1=2.5 [V]:

When the word line WL is set to 7 [V] (WLon) and the transfer transistor T is turned ON in the floating state where the potential Vb1 of the bit line BL is 2.5 [V], the potential Vb1 changes as shown in FIG. 4B based on the value (Q>0 or Q=0) of the charge Q and the information (low level:Vs=0 [V] or high level:Vs=5 [V]) stored in the storage capacitor C.

If Q>0, the capacitance C takes a large value regardless of whether the bias voltage V is +2.5 [V] or −2.5 [V]. Hence, the potential Vb1 greatly rises or falls as indicated by respective curves $BL_{+H}$ and $BL_{+L}$ shown in FIG. 4B. However, if Q=0, the potential Vb1 greatly falls as indicated by a curve $BL_{OL}$ when the bias voltage V is +2.5 [V] because the capacitance C takes a large value in this case, but the potential Vb1 virtually does not rise as indicated by a curve $BL_{OH}$ when the bias voltage V is −2.5 [V] because the capacitance C takes a small value in this case.

RAM Operation:

When carrying out the RAM operation, a volatile information read means (not shown) reads the volatile information stored in the storage capacitor C by comparing the potential Vb1 of the bit line BL with a reference potential Vre11 as shown in FIG. 4B. By this comparison, it is possible to distinguish the curve $BL_{+H}$ from the curve $BL_{+L}$ and distinguish the curve $BL_{OH}$ from the curve $BL_{OL}$. Hence, it is possible to read the volatile information stored in the storage capacitor C regardless of the value of the charge Q. The information written in the storage capacitor C gradually discharges, and thus, a refresh operation is needed for this RAM operation in order to rewrite the read result into the storage capacitor C at predetermined time intervals.

Figure 4C:
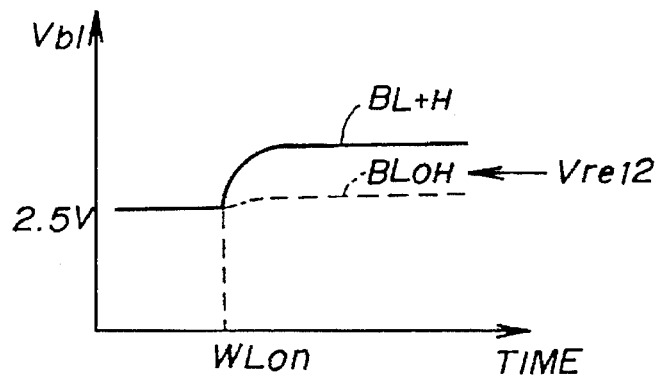

ROM Operation (I):

When carrying out the ROM operation, a non-volatile information read means (not shown) reads the non-volatile information stored in the floating gate FG by setting the word line WL to 7 [V] (WLon) in the floating state where the bit line BL is set to 2.5 [V] after writing a high-level into the storage capacitor C of each memory cell for all bits. Since the potential Vb1 of the bit line BL changes as shown in FIG. 4C, it is possible to distinguish the curve BL+H from the curve $BL_{OH}$ by comparing the potential Vb1 with a reference potential Vre12. Thus, the value of the charge Q, that is, the non-volatile ROM information stored in the floating gate FG, can be read.

The information written in the storage capacitor C gradually discharges. For this reason, when carrying out the ROM operation (I), it is necessary to perform a write operation in which a high-level is written into the storage capacitor C of each memory cell for all bits, or to perform a refresh operation in which the information is rewritten into the storage capacitor C based on the read result.

ROM Operation (II):

According to the ROM operation (I) described above, the potential difference between the curves $BL_{+H}$ and $BL_{OH}$ is small, and therefore, it is difficult to carry out the read operation at a high speed. Hence, the ROM operation can alternatively be carried out as follows in order to realize a high-speed read operation.

Figure 4D:
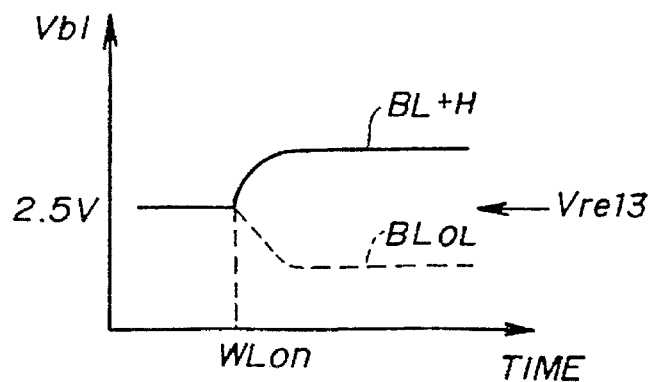

First, the ROM information stored in the floating gate FG is read similarly as in the case of the ROM operation (I). Thereafter, the information based on the read result is written into the storage capacitor C. In other words, a high-level (potential Vs=5 [V]) is written into the storage capacitor C when it is judged that Q>0, and a low level (potential Vs=0 [V]) is written into the storage capacitor C when it is judged that Q=0. Next, when the word line WL is set to 7 [V] (WLon) in the floating state where the potential Vb1 of the bit line BL is set to 2.5 [V], the potential Vb1 changes as shown in FIG. 4D. It is hence possible to distinguish the curve $BL_{+H}$ from the curve $BL_{OL}$ by comparing the potential Vb1 of the bit line BL with a reference potential Vre13. Compared to the ROM operation (I) shown in FIG. 4C, the potential difference between the curves $BL_{+H}$ and $BL_{OL}$ is larger in FIG. 4D. As a result, the two curves can be distinguished from each other with ease, thereby making the high-speed read operation possible.

In this case, the information written in the storage capacitor C also discharges gradually. For this reason, this ROM operation (II) also requires a refresh operation in which the information is rewritten into the storage capacitor at predetermined time intervals based on the read result.

Figure 4E:
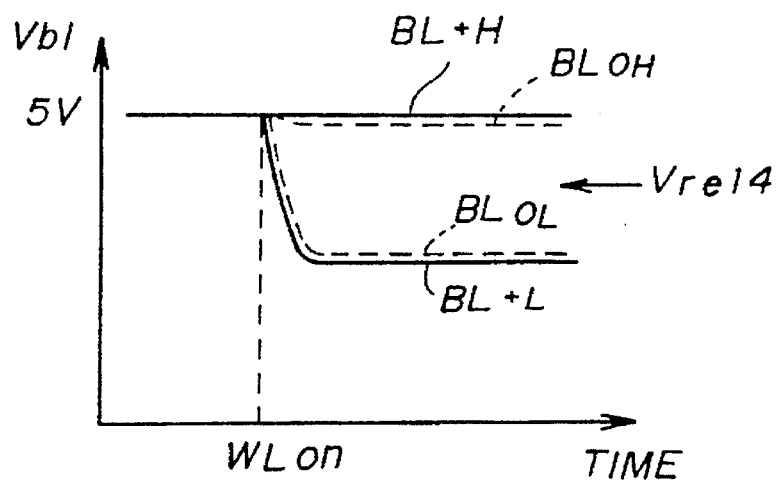

When Precharge Potential Vb1=5 [V]:

When the word line WL is set to 7 [V] (WLon) and the transfer transistor T is turned ON in the floating state where the potential Vb1 of the bit line BL is set to 5 [V], the potential Vb1 changes as shown in FIG. 4E based on the value (Q>0 or Q=0) of the charge Q and the information (low-level:Vs=0 [V] or high-level:Vs=5 [V]) stored in the storage capacitor C.

If the high-level information (Vs=5 [V]) is stored in the storage capacitor C, the potential Vb1 is maintained at 5 [V] as indicated by the curves $BL_{+H}$ and $BL_{OH}$ in FIG. 4E because the potential change of the bit line BL is independent of the capacitance C of the storage capacitor C. On the other hand, when the low-level information (Vs=0 [V]) is stored in the storage capacitor C, the potential change of the bit line BL depends on the capacitance C of the storage capacitor C. However, as shown in FIG. 4A, the capacitance C is a large value for both cases where Q>0 and Q=0. Thus, in this case, the potential Vb1 of the bit line BL falls greatly as indicated by the curves $BL_{+L}$ and $BL_{OL}$ in FIG. 4E.

RAM Operation:

When carrying out the RAM operation, the volatile information read means (not shown) can read the volatile information stored in the storage capacitor C regardless of the value of the charge Q, because the curve $BL_{+H}$ can be distinguished from the curve $BL_{+L}$ and the curve $BL_{OH}$ can be distinguished from the curve $BL_{OL}$ by comparing the potential Vb1 of the bit line BL with a reference potential Vre14 as shown in FIG. 4E. Since the information written in the storage capacitor C gradually discharges, it is necessary to carry out a refresh operation to rewrite the read result into the storage capacitor C at predetermined time intervals during this RAM operation.

ROM Operation:

In FIG. 4E, the potential difference between the curves $BL_{+H}$ and $BL_{OH}$ is zero and the potential difference between the curves $BL_{OL}$ and $BL_{+L}$ is also zero. Hence, it is impossible to distinguish the charge Q>0 from the charge Q=0, and the ROM operation cannot be made.

Figure 4F:
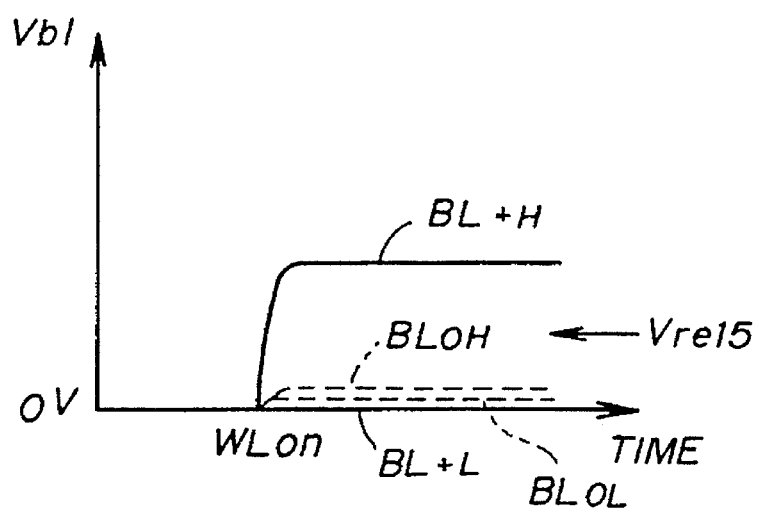

When Precharge Potential Vb1=0 [V]:

When the word line WL is set to 7 [V] (WLon) and the transfer transistor T is turned ON in the floating state where the potential Vb1 of the bit line BL is set to 0 [V], the potential Vb1 changes as shown in FIG. 4F based on the value (Q>0 or Q=0) of the charge Q and the information (low-level:Vs=0 [V] or high-level:Vs=5 [V]) stored in the storage capacitor C.

If the low-level information (Vs=0 [V]) is stored in the storage capacitor C, the potential Vb1 is maintained at 0 [V] as indicated by the curves $BL_{+L}$ and $BL_{OL}$ in FIG. 4F because the potential change of the bit line BL is independent of the capacitance C of the storage capacitor C. On the other hand, when the high-level information (Vs=5 [V]) is stored in the storage capacitor C, the potential change of the bit line BL depends on the capacitance C of the storage capacitor C. However, as shown in FIG. 4A, the capacitance C is a large value when Q>0 and in this case the potential Vb1 of the bit line BL rises greatly as indicated by the curve $BL_{+H}$ in FIG. 4F. On the other hand, the capacitance C is a small value when Q=0 and in this case the potential Vb1 of the bit line BL virtually does not change as indicated by the curve $BL_{OH}$ in FIG. 4F.

RAM Operation:

In FIG. 4F, the potential difference between the curves $BL_{OH}$ and $BL_{OL}$ is very small and it is basically impossible to carry out the RAM operation because the high and low-level information stored in the storage capacitor C cannot be distinguished from each other. However, the RAM operation is possible if a positive charge Q is injected into the floating gate FG of the memory cell for all bits. In other words, when Q>0, the potential Vb1 of the bit line BL changes as indicated by the curves $BL_{+H}$ and $BL_{+L}$. Thus, the volatile information read means (not shown) can distinguish the curves $BL_{+H}$ and $BL_{+L}$ by comparing these two curves with a reference potential Vre15, thereby making it possible to read the volatile information stored in the storage capacitor C. The information written in the storage capacitor C gradually discharges, and a refresh operation is required during this RAM operation in order to rewrite the read result into the storage capacitor C at predetermined time intervals.

Figure 4G:
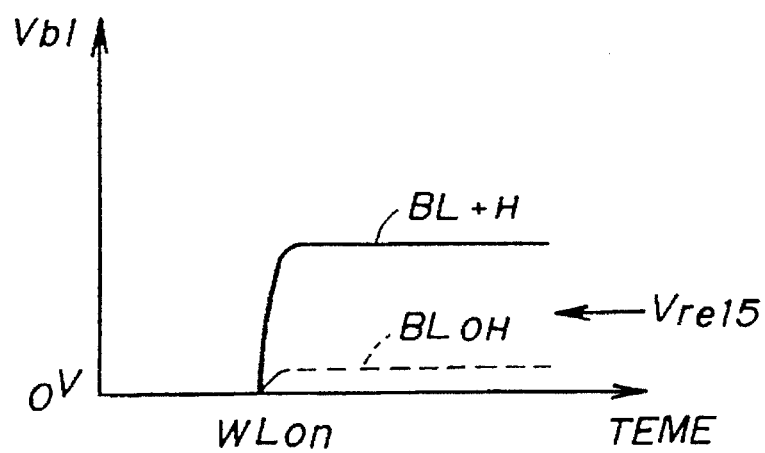

ROM Operation:

When carrying out the ROM operation, the non-volatile information read means (not shown) sets the word line WL to 7 [V] (WLon) in the floating state where the bit line BL is set to 0 [V] after writing the high-level into the storage capacitor C of each memory cell for all bits. As shown in FIG. 4G, the potential Vb1 of the bit line BL changes as indicated by the curves $BL_{+H}$ and $BL_{OH}$. Hence, the curves $BL_{+H}$ and $BL_{OH}$ can be distinguished from each other by comparing the potential Vb1 with a reference potential Vre15 shown in FIG. 4G. The value of the charge Q, that is, the non-volatile ROM information stored in the floating gate FG, can be read out.

Second Basic Read Operation (Q>0/Q<0):

A description will now be given of a second basic read operation of the first embodiment, by referring to FIG. 5.

In this second basic read operation, the information "1" or "0" is stored as the ROM based on whether the charge Q injected into the floating gate FG is positive (Q>0) or negative (Q<0). The voltage Vc of the confronting electrode CE is set to 2.5 [V], and the charge is stored in the storage capacitor C to store information so that the potential Vs of the storage capacitor C on the side of the transfer transistor T becomes 0 [V] (low level) or 5 [V] (high level). The bias voltage V (=Vc–Vs) of the storage capacitor C takes one of two values, namely, –2.5 [V] and 2.5 [V]. In this case, the capacitance versus voltage characteristic becomes as shown in FIG. 5A.

Figure 5A:
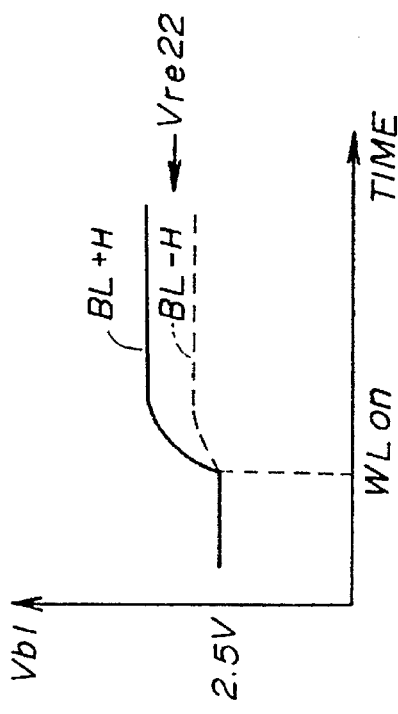
FIGS. 5A through 5G are diagrams for explaining a second basic read operation of the first embodiment.

In a state where the charge Q of the floating gate FG is positive as indicated by a solid line in FIG. 5A, the capacitance C is always takes a large value when the bias voltage V falls within a range from –2.5 [V] to 2.5 [V]. On the other hand, in a state where the charge Q is negative as indicated by a dotted line in FIG. 5A, the capacitance C always takes a small value when the bias voltage V falls within the range from –2.5 [V] to 2.5 [V].

Basically, the read operation is carried out by setting the bit line BL which is precharged by a precharge means (not shown) to a floating state and turning the transfer transistor T ON by setting the word line to 7 [V] (WLon), so that the stored information is read out based on a potential change which occurs on the bit line BL. The control of the read operation depends on the potential Vb1 to which the bit line BL is precharged.

Figure 5B:
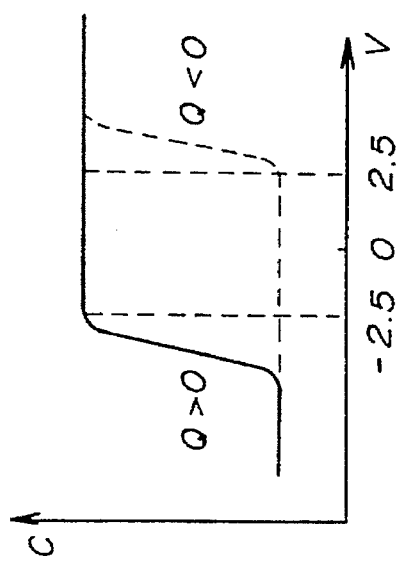
Figure 5C:
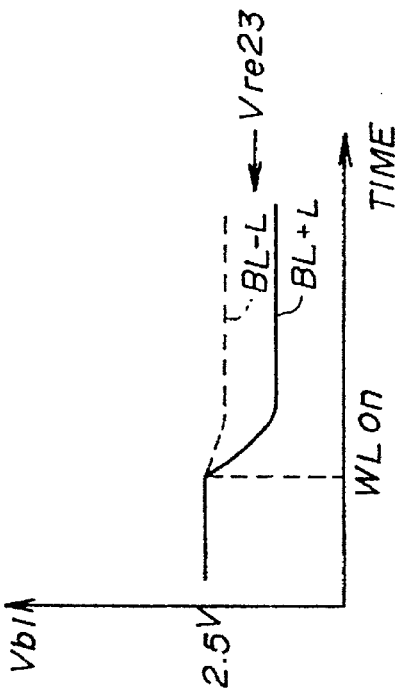

When Precharge Potential Vb1=2.5 [V]:

When the word line WL is set to 7 [V] (WLon) and the transfer transistor T is turned ON in the floating state where the potential Vb1 of the bit line BL is 2.5 [V], the potential Vb1 changes as shown in FIG. 5B based on the value (Q>0 or Q<0) of the charge Q and the information (low level:Vs=0 [V] or high level:Vs=5 [V]) stored in the storage capacitor C.

If Q>0, the capacitance C takes a large value regardless of whether the bias voltage V is +2.5 [V] or –2.5 [V]. Hence, the potential Vb1 greatly rises or falls as indicated by respective curves $BL_{+H}$ and $BL_{+L}$ shown in FIG. 5B. However, if Q<0, the potential Vb1 takes a small value regardless of whether the bias voltage V is 2.5 [V] or –2.5 [V] and the potential Vb1 rises slightly as indicated by a curve $BL_{-H}$ or falls slightly as indicated by a curve $BL_{-L}$.

RAM Operation:

When carrying out the RAM operation, a volatile information read means (not shown) reads the volatile information stored in the storage capacitor C by comparing the potential Vb1 of the bit line BL with a reference potential Vre21 as shown in FIG. 5B. By this comparison, it is possible to distinguish the curve $BL_{+H}$ from the curve $BL_{+L}$ and distinguish the curve $BL_{-H}$ from the curve $BL_{-L}$. Hence, it is possible to read the volatile information stored in the storage capacitor C regardless of the value of the charge Q. The information written in the storage capacitor C gradually discharges, and thus, a refresh operation is needed for this RAM operation in order to rewrite the read result into the storage capacitor C at predetermined time intervals.

ROM Operation (I):

When carrying out the ROM operation, a non-volatile information read means (not shown) reads the non-volatile information stored in the floating gate FG by setting the word line WL to 7 [V] (WLon) in the floating state where the bit line BL is set to 2.5 [V] after writing a high-level into the storage capacitor C of each memory cell for all bits. Since the potential Vb1 of the bit line BL changes as shown in FIG.

5C, it is possible to distinguish the curve $BL_{+H}$ from the curve $BL_{-H}$ by comparing the potential Vb1 with a reference potential Vre22. Thus, the value of the charge Q, that is, the non-volatile ROM information stored in the floating gate FG, can be read.

The information written in the storage capacitor C gradually discharges. For this reason, when carrying out the ROM operation (I), it is necessary to perform a write operation in which a high-level is written into the storage capacitor C of each memory cell for all bits, or to perform a refresh operation in which the information is rewritten into the storage capacitor C based on the read result.

ROM Operation (II):

The ROM operation can alternatively be carried out as follows.

Figure 5D:
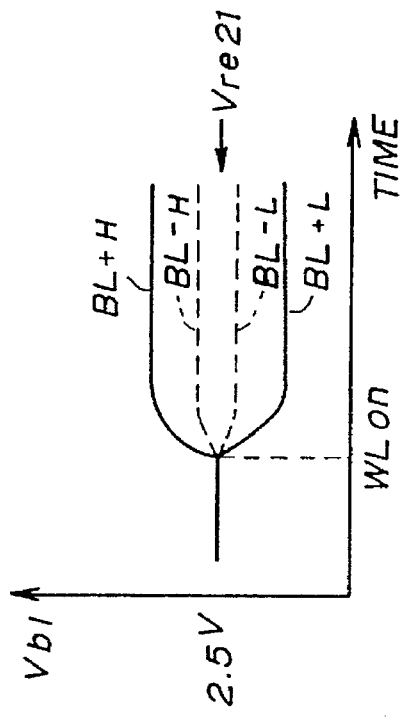

A low level is written into the storage capacitor C of each memory cell for all bits at the start, and the word line WL is set to 7 [V] (WLon) in the floating state where the bit line BL is set to 2.5 V. Because the potential Vb1 of the bit line BL changes as shown in FIG. 5D, it is possible to distinguish the curve $BL_{-L}$ from the curve $BL_{+L}$ by comparing the potential Vb1 with a reference potential Vre23. Hence, the value of the charge Q, that is, the ROM information stored in the floating gate FG, can be read.

In this case, the information written in the storage capacitor C is the low-level information. For this reason, the information will not disappear and there is no need to carry out a refresh operation.

Figure 5E:
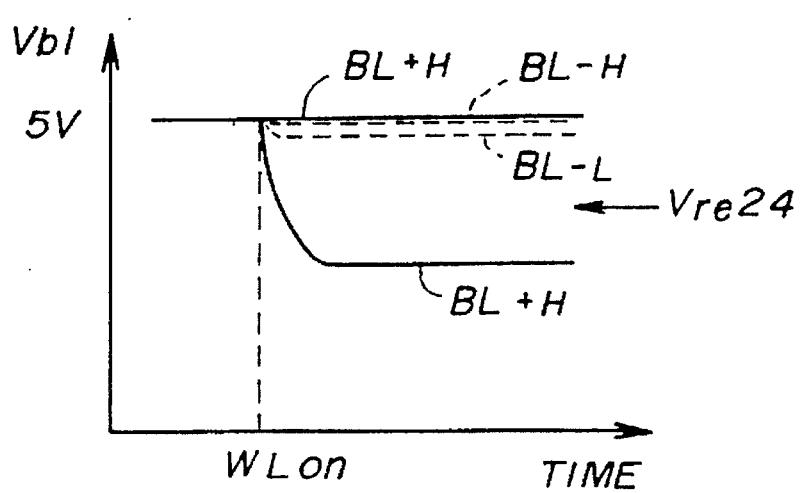

When Precharge Potential Vb1=5 [V]:

When the word line WL is set to 7 [V] (WLon) and the transfer transistor T is turned ON in the floating state where the potential Vb1 of the bit line BL is set to 5 [V], the potential Vb1 changes as shown in FIG. 5E based on the value (Q>0 or Q<0) of the charge Q and the information (low-level:Vs=0 [V] or high-level:Vs=5 [V]) stored in the storage capacitor C.

If the high-level information (Vs=5 [V]) is stored in the storage capacitor C, the potential Vb1 is maintained at 5 [V] as indicated by the curves $BL_{+H}$ and $BL_{-H}$ in FIG. 5E because the potential change of the bit line BL is independent of the capacitance C of the storage capacitor C. On the other hand, when the low-level information (Vs=0 [V]) is stored in the storage capacitor C, the potential change of the bit line BL depends on the capacitance C of the storage capacitor C. However, as shown in FIG. 5A, the capacitance C is a large value when Q>0 and is a small value when Q<0. Thus, in this case, the potential Vb1 of the bit line BL falls greatly as indicated by the curve $BL_{+L}$ or virtually does not fall as indicated by the curve $BL_{-L}$ in FIG. 5E.

RAM Operation:

In FIG. 5E, the potential difference between the curves $BL_{-H}$ and $BL_{-L}$ is very small and it is basically impossible to carry out the RAM operation because the high and low-level information stored in the storage capacitor C cannot be distinguished from each other. However, the RAM operation is possible if a positive charge Q is injected into the floating gate FG of the memory cell for all bits. In other words, when Q>0, the potential Vb1 of the bit line BL changes as indicated by the curves $BL_{+H}$ and $BL_{+L}$. Thus, the volatile information read means (not shown) can distinguish the curves $BL_{+H}$ and $BL_{+L}$ by comparing these two curves with a reference potential Vre24, thereby making it possible to read the volatile information stored in the storage capacitor C. The information written in the storage capacitor C gradually discharges, and a refresh operation is required during this RAM operation in order to rewrite the read result into the storage capacitor C at predetermined time intervals.

Figure 5F:
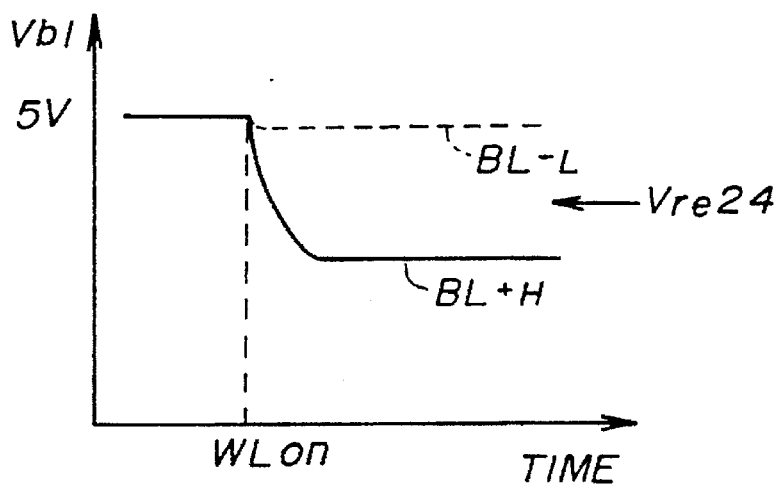

ROM Operation:

When carrying out the ROM operation, a non-volatile information read means (not shown) reads the non-volatile information stored in the floating gate FG by setting the word line WL to 7 [V] (WLon) in the floating state where the bit line BL is set to 5 [V] after writing a low-level into the storage capacitor C of each memory cell for all bits. Since the potential Vb1 of the bit line BL changes as shown in FIG. 5F, it is possible to distinguish the curve $BL_{-L}$ from the curve $BL_{+L}$ by comparing the potential Vb1 with a reference potential Vre24. Thus, the value of the charge Q, that is, the non-volatile ROM information stored in the floating gate FG, can be read.

Figure 5G:
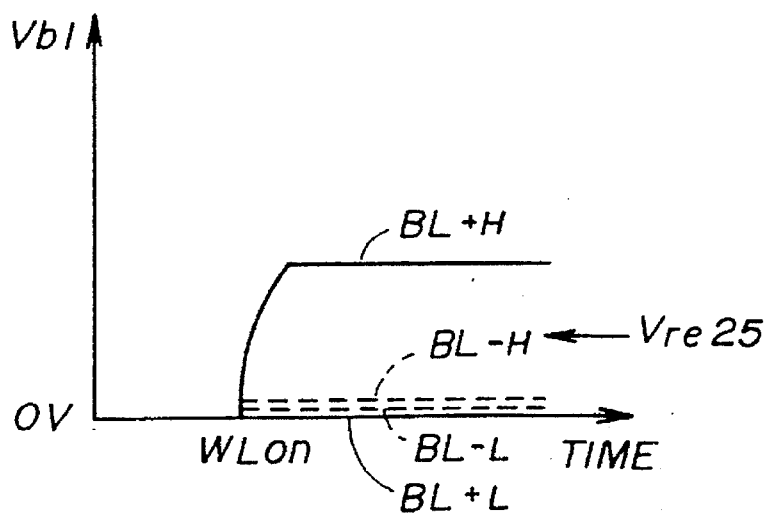

When Precharge Potential Vb1=0 [V]:

When the word line WL is set to 7 [V] (WLon) and the transfer transistor T is turned ON in the floating state where the potential Vb1 of the bit line BL is set to 0 [V], the potential Vb1 changes as shown in FIG. 5G based on the value (Q>0 or Q<0) of the charge Q and the information (low-level:Vs=0 [V] or high-level:Vs=5 [V]) stored in the storage capacitor C.

If the low-level information (Vs=0 [V]) is stored in the storage capacitor C, the potential Vb1 is maintained at 0 [V] as indicated by the curves $BL_{+L}$ and $BL_{-L}$ in FIG. 5G because the potential change of the bit line BL is independent of the capacitance C of the storage capacitor C. On the other hand, when the high-level information (Vs=5 [V]) is stored in the storage capacitor C, the potential change of the bit line BL depends on the capacitance C of the storage capacitor C. However, as shown in FIG. 5A, the capacitance C is a large value when Q>0 and in this case the potential Vb1 of the bit line BL rises greatly as indicated by the curve $BL_{+H}$ in FIG. 5G. On the other hand, the capacitance C is a small value when Q<0 and in this case the potential Vb1 of the bit line BL virtually does not change as indicated by the curve $BL_{-H}$ in FIG. 5G.

RAM Operation:

In FIG. 5G, the potential difference between the curves $BL_{-H}$ and $BL_{-L}$ is very small and it is basically impossible to carry out the RAM operation because the high and low-level information stored in the storage capacitor C cannot be distinguished from each other. However, the RAM operation is possible if a positive charge Q is injected into the floating gate FG of the memory cell for all bits. In other words, when Q>0, the potential Vb1 of the bit line BL changes as indicated by the curves $BL_{+H}$ and $BL_{+L}$. Thus, the volatile information read means (not shown) can distinguish the curves $BL_{+H}$ and $BL_{+L}$ by comparing these two curves with a reference potential Vre25, thereby making it possible to read the volatile information stored in the storage capacitor C. The information written in the storage capacitor C gradually discharges, and a refresh operation is required during this RAM operation in order to rewrite the read result into the storage capacitor C at predetermined time intervals.

ROM Operation:

When carrying out the ROM operation, the non-volatile information read means (not shown) sets the word line WL to 7 [V] (WLon) in the floating state where the bit line BL is set to 0 [V] after writing the high-level into the storage capacitor C of each memory cell for all bits. As shown in FIG. 5G, the potential Vb1 of the bit line BL changes as indicated by the curves $BL_{+H}$ and $BL_{-H}$. Hence, the curves $BL_{+H}$ and $BL_{-H}$ can be distinguished from each other by comparing the potential Vb1 with a reference potential Vre25 shown in FIG. 5G. The value of the charge Q, that is, the non-volatile ROM information stored in the floating gate FG, can be read out.

Third Basic Read Operation (Q=0/Q<0):

A description will now be given of a third basic read operation of the first embodiment, by referring to FIG. 6.

Figure 6A:
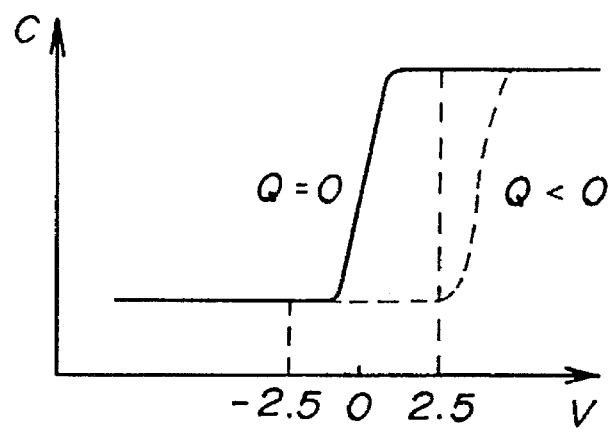
FIGS. 6A through 6F are diagrams for explaining a third basic read operation of the first embodiment.

In this third basic read operation, the information "1" or "0" is stored in the ROM based on whether the charge Q injected into the floating gate FG is zero (Q=0) or negative (Q<0). The voltage Vc of the confronting electrode CE is set to 2.5 [V], and the charge is stored in the storage capacitor C to store information so that the potential Vs of the storage capacitor C on the side of the transfer transistor T becomes 0 [V] (low level) or 5 [V] (high level). The bias voltage V (=Vc−Vs) of the storage capacitor C takes one of two values, namely, −2.5 [V] and 2.5 [V]. In this case, the capacitance versus voltage characteristic becomes as shown in FIG. 6A.

In a state where the charge Q of the floating gate FG is zero as indicated by a solid line in FIG. 4A, the capacitance C is takes a small value when the bias voltage V is −2.5 [V] and takes a large value when the bias voltage V is +2.5 [V]. On the other hand, in a state where the charge Q is negative as indicated by a dotted line in FIG. 6A, the capacitance C takes a small value when the bias voltage V falls within a range from −2.5 [V] to +2.5 [V].

Basically, the read operation is carried out by setting the bit line BL which is precharged by a precharge means (not shown) to a floating state and turning the transfer transistor T ON by setting the word line to 7 [V] (WLon), so that the stored information is read out based on a potential change which occurs on the bit line BL. The control of the read operation depends on a potential Vb1 to which the bit line BL is precharged.

Figure 6B:
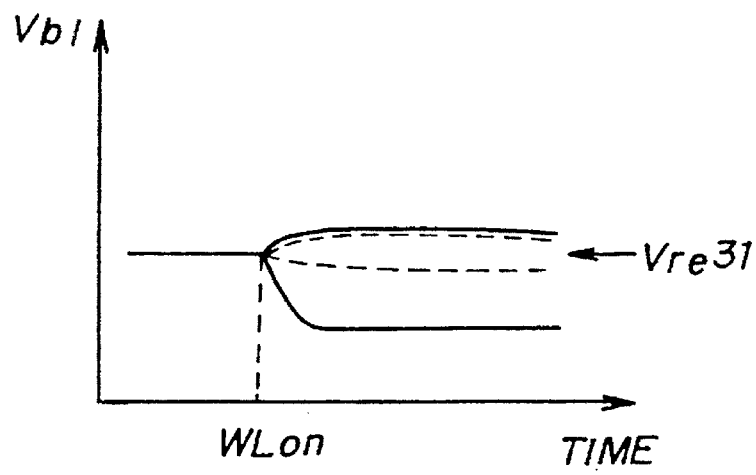

When Precharge Potential Vb1=2.5 [V]:

When the word line WL is set to 7 [V] (WLon) and the transfer transistor T is turned ON in the floating state where the potential Vb1 of the bit line BL is 2.5 [V], the potential Vb1 changes as shown in FIG. 6B based on the value (Q=0 or Q<0) of the charge Q and the information (low level:Vs=0 [V] or high level:Vs=5 [V]) stored in the storage capacitor C.

If Q=0, the potential Vb1 greatly falls as indicated by a curve $BL_{OL}$ in FIG. 6B when the bias voltage V is +2.5 [V] because the capacitance C takes a large value in this case, but the potential Vb1 virtually does not rise as indicated by a curve $BL_{OH}$ when the bias voltage V is −2.5 [V] because the capacitance C takes a small value in this case. If Q<0, the capacitance C takes a small value regardless of whether the bias voltage V is +2.5 [V] or −2.5 [V]. Hence, the potential Vb1 slightly rises or falls as indicated by respective curves $BL_{-H}$ and $BL_{-L}$ shown in FIG. 6B.

RAM Operation:

When carrying out the RAM operation, a volatile information read means (not shown) reads the volatile information stored in the storage capacitor C by comparing the potential Vb1 of the bit line BL with a reference potential Vre31 as shown in FIG. 6B. By this comparison, it is possible to distinguish the curve $BL_{OH}$ from the curve $BL_{-L}$ and distinguish the curve $BL_{-H}$ from the curve $BL_{OL}$. Hence, it is possible to read the volatile information stored in the storage capacitor C regardless of the value of the charge Q. The information written in the storage capacitor C gradually discharges, and thus, a refresh operation is needed for this RAM operation in order to rewrite the read result into the storage capacitor C at predetermined time intervals.

Figure 6C:
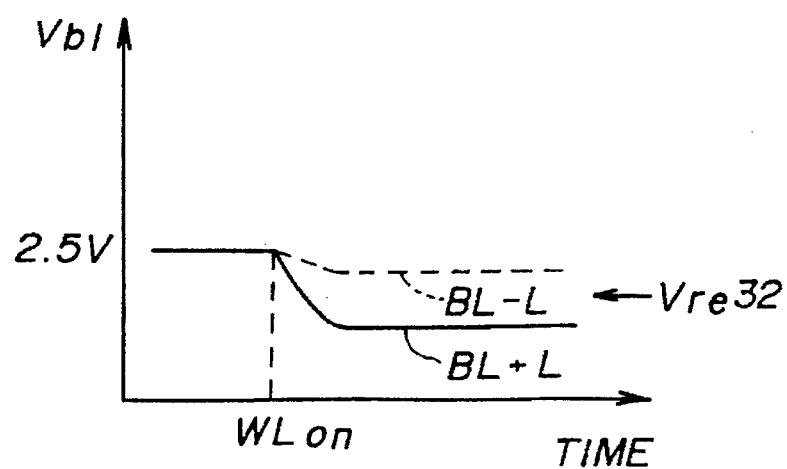

When carrying out the ROM operation, the non-volatile information read means (not shown) sets the word line WL to 7 [V] (WLon) in the floating state where the bit line BL is set to 2.5 [V] after writing the low-level into the storage capacitor C of each memory cell for all bits. As shown in FIG. 6C, the potential Vb1 of the bit line BL changes as indicated by the curves $BL_{-L}$ and $BL_{OL}$. Hence, the curves $BL_{-L}$ and $BL_{OL}$ can be distinguished from each other by comparing the potential Vb1 with a reference potential Vre32 shown in FIG. 6C. The value of the charge Q, that is, the non-volatile ROM information stored in the floating gate FG, can be read out.

In this case, the information written in the storage capacitor C is the low-level information. For this reason, the information will not disappear and there is no need to carry out a refresh operation.

Figure 6D:
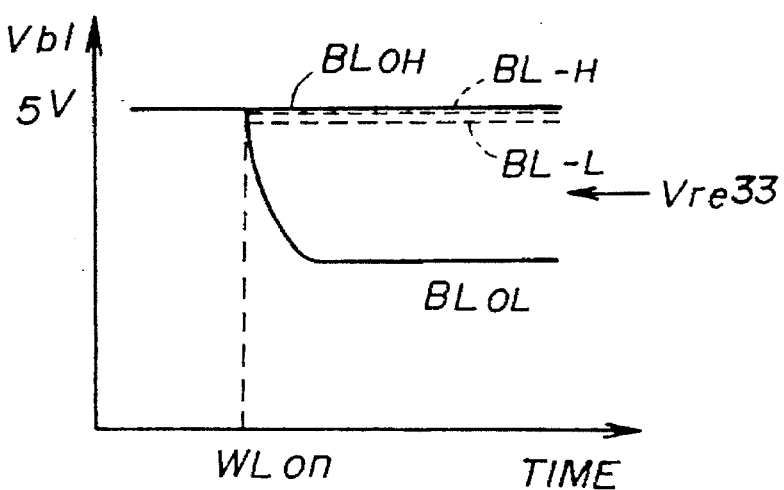

When Precharge Potential Vb1=5 [V]:

When the word line WL is set to 7 [V] (WLon) and the transfer transistor T is turned ON in the floating state where the potential Vb1 of the bit line BL is set to 5 [V], the potential Vb1 changes as shown in FIG. 6D based on the value (Q=0 or Q<0) of the charge Q and the information (low-level:Vs=0 [V] or high-level:Vs=5 [V]) stored in the storage capacitor C.

If the high-level information (Vs=5 [V]) is stored in the storage capacitor C, the potential Vb1 is maintained at 5 [V] as indicated by the curves $BL_{OH}$ and $BL_{-H}$ in FIG. 6D because the potential change of the bit line BL is independent of the capacitance C of the storage capacitor C. On the other hand, when the low-level information (Vs=0 [V]) is stored in the storage capacitor C, the potential change of the bit line BL depends on the capacitance C of the storage capacitor C. However, as shown in FIG. 4A, the capacitance C is a large value when Q=0 and is a small value when Q<0. Thus, in this case, the potential Vb1 of the bit line BL falls greatly as indicated by the curve $BL_{OL}$ or virtually does not change as indicated by the curve $BL_{-L}$ in FIG. 6D.

RAM Operation:

In FIG. 6D, the potential difference between the curves $BL_{-H}$ and $BL_{-L}$ is very small and it is basically impossible to carry out the RAM operation because the high and low-level information stored in the storage capacitor C cannot be distinguished from each other. However, the RAM operation is possible if a positive charge Q is injected into the floating gate FG of the memory cell for all bits. In other words, when Q=0, the potential Vb1 of the bit line BL changes as indicated by the curves $BL_{OH}$ and $BL_{OL}$. Thus, the volatile information read means (not shown) can distinguish the curves $BL_{OH}$ and $BL_{OL}$ by comparing these two curves with a reference potential Vre33, thereby making it possible to read the volatile information stored in the storage capacitor C. The information written in the storage capacitor C gradually discharges, and a refresh operation is required during this RAM operation in order to rewrite the read result into the storage capacitor C at predetermined time intervals.

Figure 6E:
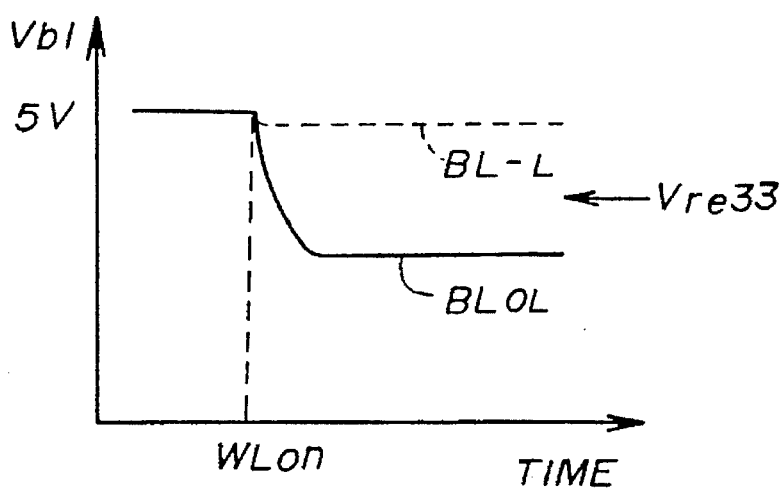

ROM Operation:

When carrying out the ROM operation, the non-volatile information read means (not shown) sets the word line WL to 7 [V] (WLon) in the floating state where the bit line BL is set to 5 [V] after writing the low-level into the storage capacitor C of each memory cell for all bits. As shown in FIG. 6E, the potential Vb1 of the bit line BL changes as indicated by the curves $BL_{OL}$ and $BL_{-L}$. Hence, the curves $BL_{OL}$ and $BL_{-L}$ can be distinguished from each other by comparing the potential Vb1 with a reference potential Vre33 shown in FIG. 6E. The value of the charge Q, that is, the non-volatile ROM information stored in the floating gate FG, can be read out.

In this case, the information written in the storage capacitor C is the low-level information. For this reason, the information will not disappear and there is no need to carry out a refresh operation.

Figure 6F:
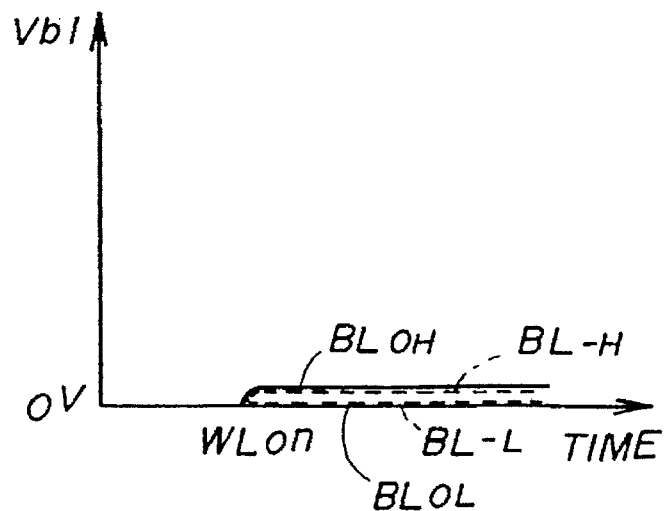

When Precharge Potential Vb1=0 [V]:

When the word line WL is set to 7 [V] (WLon) and the transfer transistor T is turned ON in the floating state where the potential Vb1 of the bit line BL is set to 0 [V], the potential Vb1 changes as shown in FIG. 6F based on the value (Q=0 or Q<0) of the charge Q and the information (low-level:Vs=0 [V] or high-level:Vs=5 [V]) stored in the storage capacitor C.

If the low-level information (Vs=0 [V]) is stored in the storage capacitor C, the potential Vb1 is maintained at 0 [V] as indicated by the curves $BL_{OL}$ and $BL_{-L}$ in FIG. 6F because the potential change of the bit line BL is independent of the capacitance C of the storage capacitor C. On the other hand, when the high-level information (Vs=5 [V]) is stored in the storage capacitor C, the potential change of the bit line BL depends on the capacitance C of the storage capacitor C. However, as shown in FIG. 6A, the capacitance C is a small value for both cases where Q=0 and Q<0. Thus, in this case, the potential Vb1 of the bit line BL virtually does not change as indicated by the curves $BL_{-H}$ and $BL_{-L}$ in FIG. 6F.

RAM Operation:

In the case shown in FIG. 6F, there is very little potential difference among the curves $BL_{OH}$, $BL_{-H}$, $BL_{-L}$ and $BL_{OL}$. Hence, it is impossible to distinguish the high and low-level information stored in the storage capacitor C, and the RAM operation cannot be realized.

ROM Operation:

In the case shown in FIG. 6F, there is very little potential difference among the curves $BL_{OH}$, $BL_{-H}$, $BL_{-L}$ and $BL_{OL}$. Hence, it is impossible to distinguish whether Q=0 or Q<0, and the ROM operation cannot be realized.

Modification of Read Operation:

In the first through third basic read operations, the voltage Vc of the confronting electrode CE is set to 2.5 [V]. However, the bias voltage V which is applied to the storage capacitor C may be varied between the case where the information is a high-level and the case where the information is a low-level, by varying the voltage Vc of the confronting electrode CE. As a result, the capacitance C of the storage electrode C can be set arbitrarily, and a predetermined read operation becomes possible depending on the set capacitance C.

First Basic Write Operation:

A first basic write operation will now be described with reference to FIG. 7.

Figures 7A, 7B:
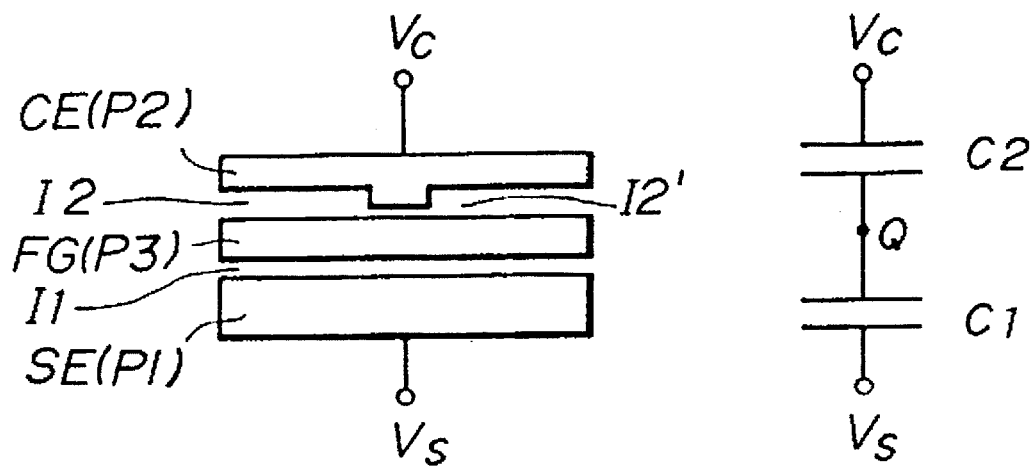
FIGS. 7A and 7B are diagrams for explaining a first basic write operation of the first embodiment.

FIG. 7A shows the structure of the storage capacitor C for a first operating example, and FIG. 7B shows an equivalent circuit of FIG. 7A. According to this storage capacitor C, a portion of an insulator layer I2 between the confronting electrode CE (polysilicon layer P2) and the floating gate FG (polysilicon layer P3) is made thin to form a tunnel insulator layer portion I2' for facilitating a flow of a tunnel current. In addition, the capacitance C2 which is formed by the confronting electrode CE and the floating gate FG which sandwich the insulator layer is set smaller than the capacitance C1 which is formed by the storage electrode SE and the floating gate which sandwich the insulator layer I1, so that a large voltage is applied across the confronting electrode CE and the floating gate FG. In other words, a voltage $V_{C1}$ is applied to the capacitor C1 which has the capacitance C1 and a voltage $V_{C2}$ is applied to the capacitor C2 which has the capacitance C2, where the voltages $V_{C1}$ and $V_{C2}$ are described by the following formulas.

$V_{C1}=[C2/(C1+C2)](Vc-Vs)$ $V_{C2}=[C1/(C1+C2)](Vc-Vs)$

For example, the capacitance C1 is twice the capacitance C2.

Figure 3:
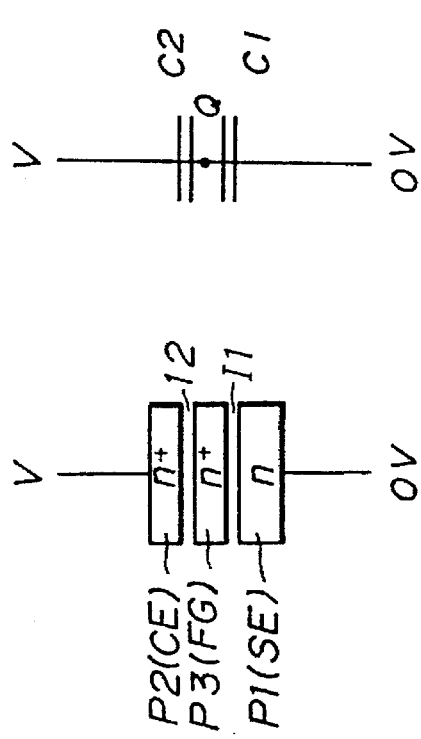
FIG. 3 is a circuit diagram showing a basic structure of a memory cell of a first embodiment of a semiconductor memory device according to the present invention.

Writing of Positive Charge Q (Erasing of Negative Charge Q):

It is assumed that the storage capacitor C shown in FIG. 3 has the structure shown in FIG. 7A. The bit line BL is set to 0 [V], the confronting electrode CE is set to 15 [V], and a voltage of 15 [V], for example, is applied to the word line WL to turn ON the transfer transistor T. In this case, a voltage of 10 [V] which is ⅔ the 15 [V] applied to the storage capacitor C is applied across the confronting electrode CE and the floating gate FG. Hence, a current flows from the confronting electrode CE to the floating gate FG through the tunnel insulator layer portion I2' and a positive charge Q is written. If a negative charge is already injected in the floating gate FG, this negative charge is erased.

Writing of Negative Charge Q (Erasing of Positive Charge Q):

The bit line BL is set to 15 [V], the confronting electrode CE is set to 0 [V], and a voltage of 15 [V], for example, is applied to the word line WL to turn ON the transfer transistor T. In this case, a voltage of 10 [V] which is ⅔ the 15 [V] applied to the storage capacitor C is applied across the confronting electrode CE and the floating gate FG. Hence, a current flows from the floating gate FG to the confronting electrode CE through the tunnel insulator layer portion I2' and a negative charge Q is written. If a positive charge is already injected in the floating gate FG, this positive charge is erased.

Second Basic Write Operation:

A second basic write operation will now be described with reference to FIG. 8.

Figure 8:
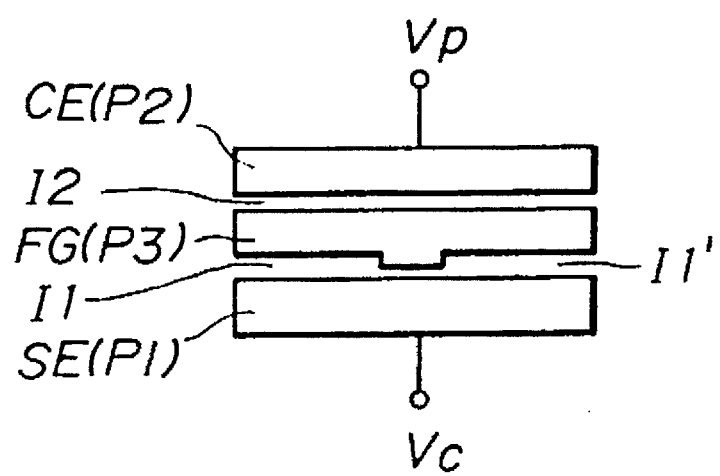
FIG. 8 is a diagram for explaining a second basic write operation of the first embodiment.

FIG. 8 shows the structure of the storage capacitor C for a second operating example. According to this storage capacitor C, a portion of the insulator layer I1 between the floating gate FG and the storage electrode SE on the side of the transfer transistor T is made thin to form a tunnel insulator layer portion I1' so as to facilitate a flow of a tunnel current. In addition, the capacitance C1 formed by the storage electrode SE and the floating gate FG which sandwich the insulator layer I1 is set smaller than the capacitance C2 formed by the confronting electrode CE and the floating gate which sandwich the insulator layer I2, so that a large voltage is applied across the storage electrode SE and the floating gate FG. Furthermore, a large voltage is applied across the confronting electrode CE and the floating gate FG. For example, the capacitance C1 is twice the capacitance C2.

Writing of Positive Charge Q (Erasing of Negative Charge Q):

It is assumed that the storage capacitor C shown in FIG. 3 has the structure shown in FIG. 8. The bit line BL is set to 15 [V], the confronting electrode CE is set to 0 [V], and a voltage of 15 [V], for example, is applied to the word line WL to turn ON the transfer transistor T. In this case, a voltage of 10 [V] which is ⅔ the 15 [V] applied to the storage capacitor C is applied across the storage electrode SE and the floating gate FG. Hence, a current flows from the storage electrode SE to the floating gate FG through the tunnel insulator layer portion I1' and a positive charge Q is written. If a negative charge is already injected in the floating gate FG, this negative charge is erased.

Writing of Negative Charge Q (Erasing of Positive Charge Q):

The bit line BL is set to 0 [V], the confronting electrode CE is set to 15 [V], and a voltage of 15 [V], for example, is applied to the word line WL to turn ON the transfer transistor T. In this case, a voltage of 10 [V] which is ⅔ the 15 [V] applied to the storage capacitor C is applied across the storage electrode SE and the floating gate FG. Hence, a current flows from the floating gate FG to the storage electrode SE through the tunnel insulator layer portion I1' and a negative charge Q is written. If a positive charge is already injected in the floating gate FG, this positive charge is erased.

Therefore, the present invention realizes the hysteresis characteristic without the use of a special material, and it is possible to realize both the ROM function and the RAM function.

First Embodiment:

Next, a description will be given of a first embodiment of the semiconductor memory device according to the present invention, by referring to FIGS. 9 through 12.

Figure 9:
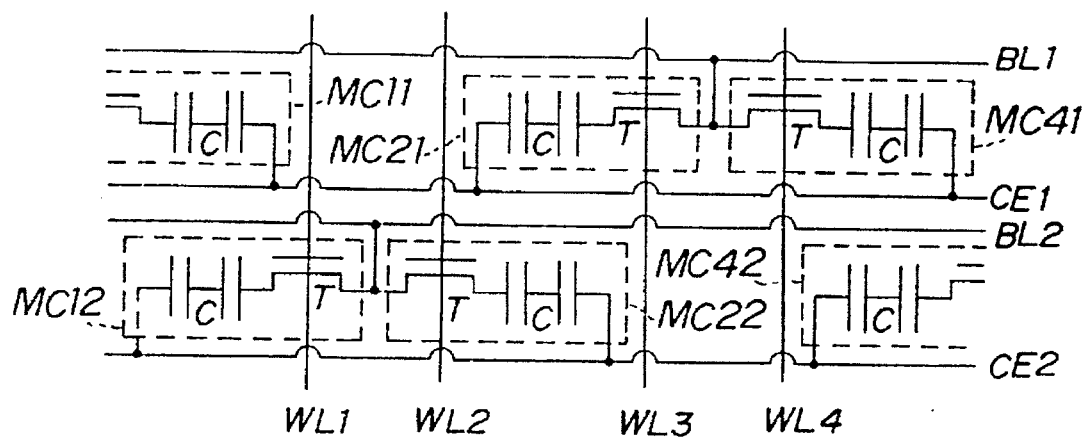
FIG. 9 shows an essential part of a layout of the first embodiment.

Structure:

In this embodiment, memory cells MC11, MC12, . . . of the semiconductor memory device are arranged with a layout shown in FIG. 9. In FIG. 9, word lines WL1, WL2, . . . run vertically, bit lines BL1, BL2, . . . run horizontally, and confronting electrodes CE1, CE2, . . . run horizontally. The confronting electrodes CE1, CE2, . . . are isolated for the corresponding bit lines BL1, BL2, . . . The memory cells MC11, MC12, . . . are arranged at intersections of corresponding word lines WL1, WL2, . . . and bit lines BL1, BL2, . . . A sense amplifier (not shown) is connected to the bit lines BL1, BL2, . . .

Each of the memory cells MC11, MC12, . . . are made up of the storage capacitor C which stores the information and the transfer transistor T for reading and writing the information. The gate of the transfer transistor T is connected to the word line WL. The source of the transfer transistor T is connected to the bit line BL. The drain of the transfer transistor T is connected to the storage electrode SE of the storage capacitor C.

Figure 10:
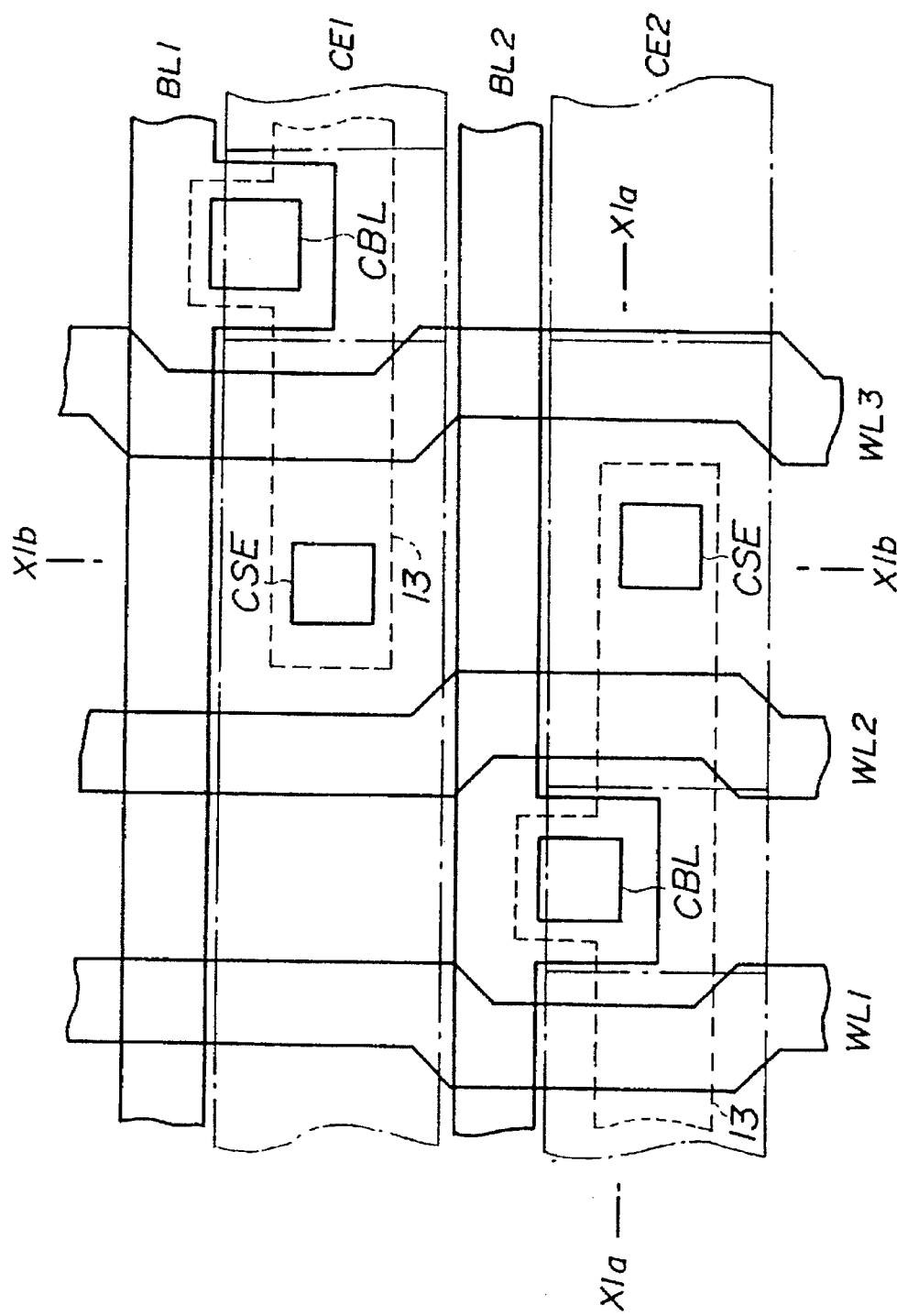
FIG. 10 is a plan view showing an essential part of the first embodiment.
Figure 11A:
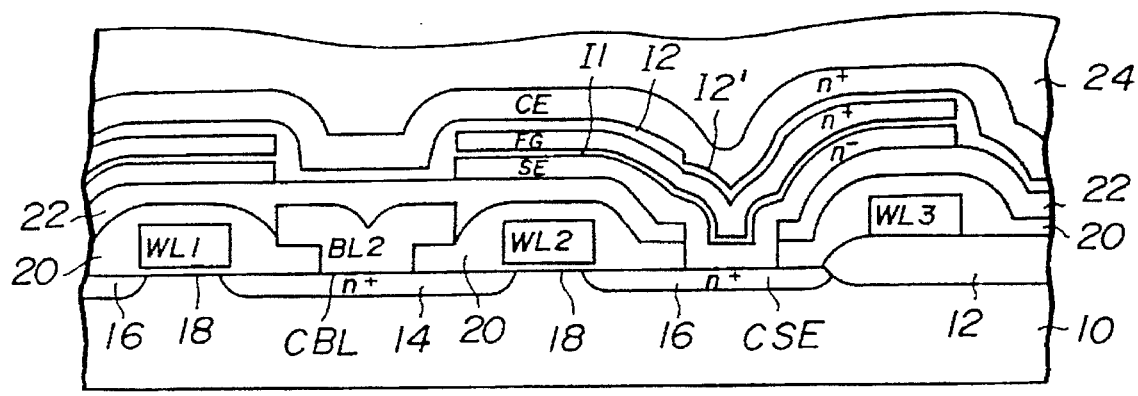
FIGS. 11A and 11B are cross sectional views showing an essential part of the first embodiment.
Figure 11B:
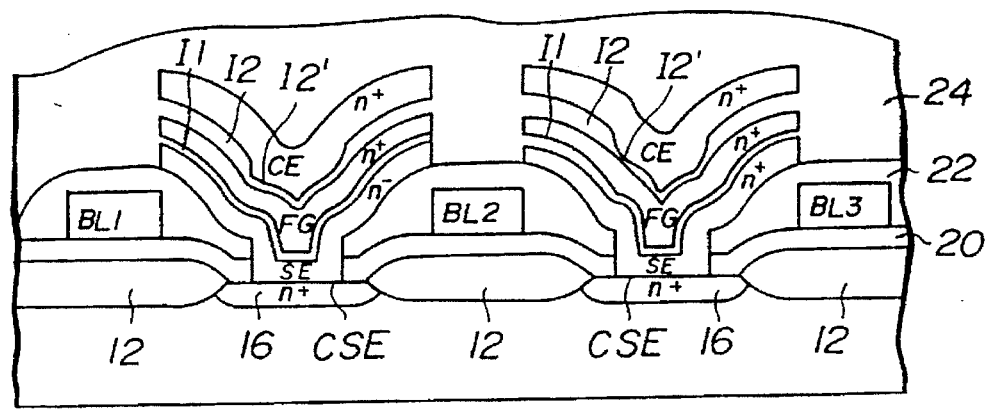

Next, a more detailed description will be given of the first embodiment, by referring to FIGS. 10 and 11. FIG. 10 is a plan view of an essential part of the first embodiment, FIG. 11A is a cross section taken along a line XIa—XIa in FIG. 10, and FIG. 11B is a cross section taken along a line XIb—XIb in FIG. 10.

A source region 14 and a drain region 16 of the transfer transistor T are formed in an active region 13 isolated by a field oxide layer 12 which is formed on a surface of a semiconductor substrate 10. The word lines WL1 and WL2 are provided via a gate oxide layer 18 between the source and drain regions 14 and 16. The word line WL3 is provided on the field oxide layer 12. An oxide layer 20 is formed on the word lines WL1, WL2 and WL3. The bit lines BL1 and BL2 make contact with the source region 14 (bit line contact CBL) via a contact hole which is formed in the oxide layer 20.

The storage capacitor C is formed on the oxide layer 22. The floating gate FG is formed on the storage electrode SE via the insulator layer I1. The confronting electrode CE is formed on the floating gate FG via the insulator layer I2. The storage electrode SE makes contact with the drain region 16 (storage contact CSE) via contact holes which are formed in the oxide layers 20 and 22.

The insulator layer I2 between the confronting electrode CE and the floating gate FG has the thin tunnel insulator layer portion I2' above the storage contact CSE, so that the flow of the tunnel current is facilitated. The charge Q is injected into the floating gate FG via the tunnel insulator layer portion I2'.

A PSG layer 24 is formed on the confronting electrode CE in order to protect the storage capacitor C and the device as a whole.

Production Method:

Next, a method of producing the first embodiment will be described with reference to FIGS. 12A through 12G. In each of FIGS. 12A through 12G, the right hand side shows the cross section taken along the line XIa—XIa in FIG. 10 and the left hand side shows the cross section taken along the line XIb—XIb in FIG. 10.

Figure 12A:
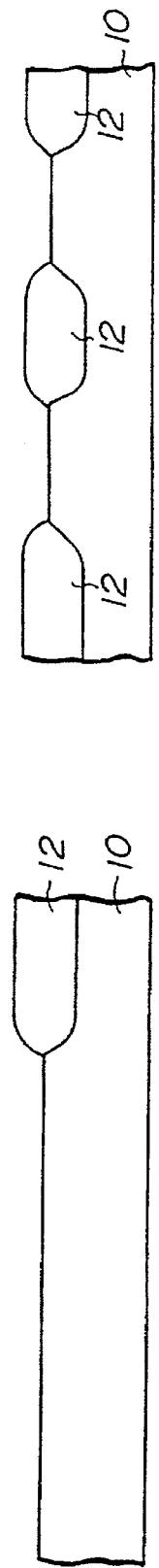

First, the surface of the semiconductor substrate 10 is selectively oxidized to form the field oxide layer 12 and define the active region 13 as shown in FIG. 12A.

Figure 12B:
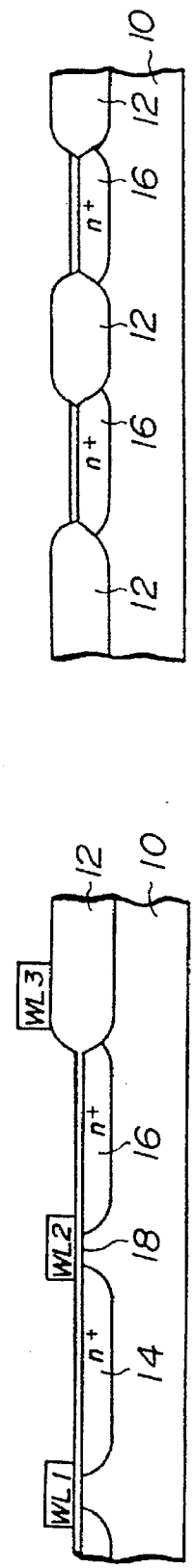

Then, the surface of the active region 13 is thermally oxidized to form the gate oxide layer 18 as shown in FIG. 12B. In addition, a polysilicon layer is formed and thereafter patterned to form the word lines WL1, WL2 and WL3. Within the active region 13, the polysilicon layer forms gate electrodes via the gate oxide layer 18, while in other regions the polysilicon layer is formed on the field oxide layer 12. Next, the word lines WL1, WL2 and WL3 which are gate electrodes and field oxide layers are used as masks, and an ion implantation is made to form the source region 14 and the drain region 16.

Figure 12C:
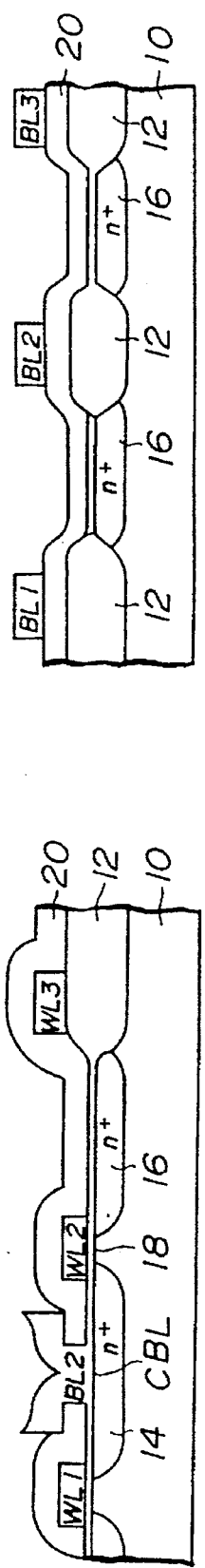

Thereafter, the CVD oxide layer 20 is formed, and a contact hole is formed in a region where the bit line contact CBL is to be made to the source region 14, as shown in FIG. 12C. In addition, a polysilicon layer is formed and then patterned to form the bit lines BL1, BL2 and BL3.

Figure 12D:
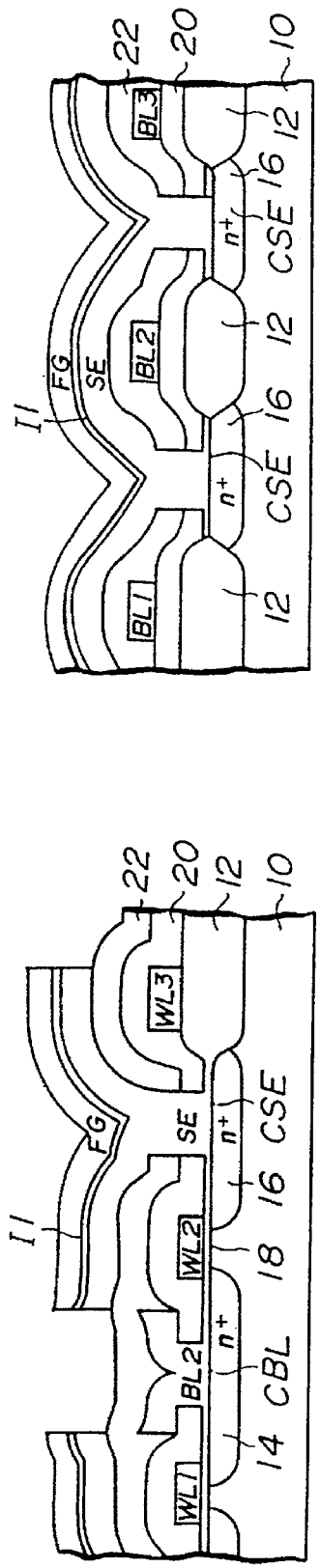

Then, as shown in FIG. 12D, the CVD oxide layer 22 is formed, and contact holes are thereafter formed in the CVD oxide layers 20 and 22 in a region where the storage contact CSE is to be made to the drain region 16. In addition, a polysilicon layer which becomes the storage electrode SE is formed to a thickness of 1000 Å, for example. Arsenic (As) ions are implanted into this polysilicon layer with a dosage of $1\times10^{13}$ cm$^{-2}$, for example, to form an n$^-$-type polysilicon layer. Next, after forming an oxide layer which becomes the insulator layer I1, a polysilicon layer which becomes the floating gate FG is formed. Impurities are added to this polysilicon layer by a thermal diffusion using POCl$_3$ as the source, so that an n$^+$-type polysilicon layer having an impurity density of at least $10^{21}$ cm$^{-3}$ is formed.

Next, as shown in FIG. 12D, the n$^-$-type polysilicon layer, the oxide layer and the n$^+$-type polysilicon layer thus formed are etched using the same mask. In other words, the storage electrode SE, the insulator layer I1 and the floating gate FG are formed simultaneously in the vertical direction in FIG. 10.

Figure 12E:
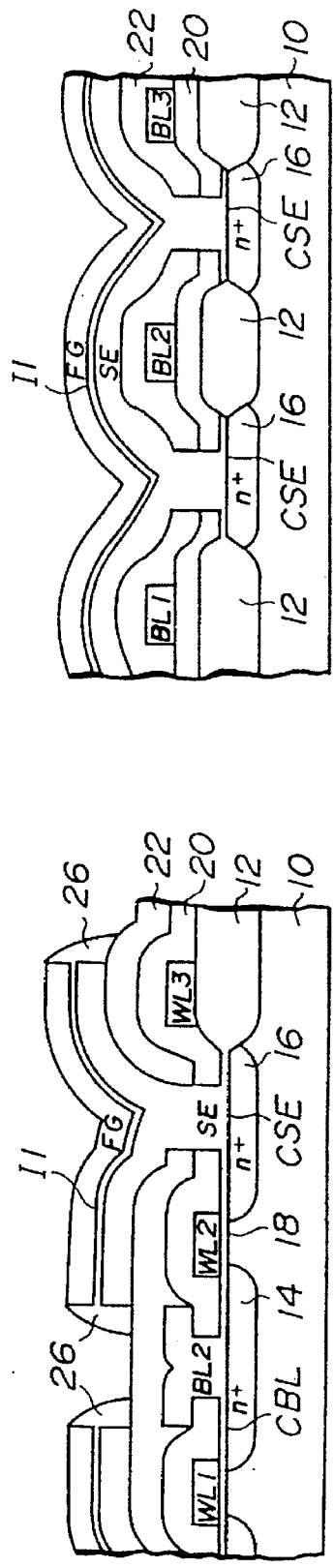

Thereafter, the entire surface is oxidized to ensure a sufficiently high withstand voltage of the oxide layer. In addition, a CVD oxide layer is formed and then etched by a vertical anisotropic etching such as RIE, so as to form an oxide layer 26 on the sidewalls of the storage electrode SE, the insulator layer I1 and the floating gate FG as shown in FIG. 12E. The oxide layer 26 is formed to ensure a sufficiently high insulation withstand voltage between the side of the storage electrode SE and the confronting electrode CE which is formed at a later stage, and to reduce the coupling capacitance between the storage electrode SE and the confronting electrode CE.

After forming on the entire surface an oxide layer which becomes the insulator layer I2, an etching is made to remove the oxide layer in a region where the tunnel insulator layer portion I2' is formed, as shown in FIG. 12F.

Next, a thermal oxidation is carried out to form the tunnel insulator layer portion I2'. In addition, a polysilicon layer which becomes the confronting electrode CE is formed on the entire surface. Impurities are added to this polysilicon layer by a thermal diffusion using $POCl_3$ as the source, so that an $n^+$-type polysilicon layer having an impurity concentration of at least $10^{21}$ cm$^{-3}$ is formed.

Then, the storage electrode SE, the insulator layer I1, the floating gate FG, the insulator layer I2 and the $n^+$-type polysilicon layer are etched by use of the same mask, so as to simultaneously form the storage electrode SE, the insulator layer I1, the floating gate FG, the insulator layer I2 and the confronting electrode CE shown in FIG. 12G in the horizontal direction in FIG. 10.

Next, the PSG layer 24 is formed on the entire surface, and the production of the semiconductor memory device ends.

Second Embodiment:

Next, a description will be given of a second embodiment of the semiconductor memory device according to the present invention, by referring to FIGS. 13 through 17.

Figure 13:
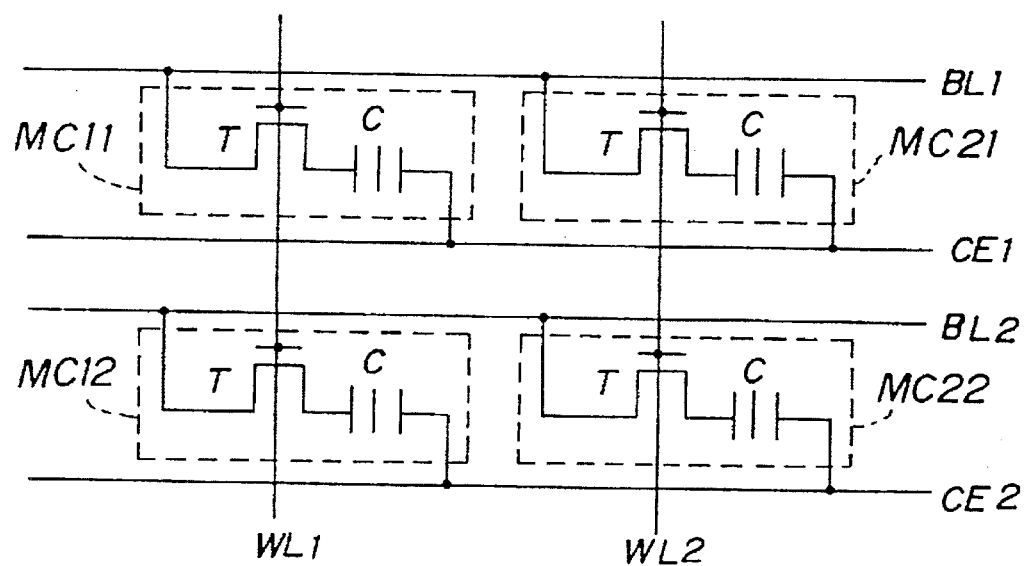
FIG. 13 shows an essential part of a layout of a second embodiment of the semiconductor memory device according to the present invention.

Basic Structure:

FIG. 13 shows the basic structure of an essential part of the second embodiment in concept.

In FIG. 13, the word lines WL1, WL2, ... run vertically, the bit lines BL1, BL2, ... run horizontally, and the confronting electrodes CE1, CE2, ... run horizontally similarly to the bit lines BL1, BL2, ... The confronting electrodes CE1, CE2, ... are isolated for the corresponding bit lines BL1, BL2, ... The memory cells MC11, MC12, ... are arranged at intersections of corresponding word lines WL1, WL2, ... and bit lines BL1, BL2, ... A sense amplifier (not shown) is connected to the bit lines BL1, BL2, ... to detect the potentials thereof.

Each of the memory cells MC11, MC12, ... are made up of the storage capacitor C which stores the information and the transfer transistor T for reading and writing the information. The gate of the transfer transistor T is connected to the word line WL. The source of the transfer transistor T is connected to the bit line BL. The drain of the transfer transistor T is connected to the storage electrode SE of the storage capacitor C. In FIG. 13, the storage capacitor C is illustrated differently from FIG. 1.

In the storage capacitor C shown in FIG. 13, the charge storage layer EL is inserted between the storage electrode SE and the confronting electrode CE. The RAM information is stored by the storage capacitance C, and the ROM information is stored by injecting the charge Q into the charge storage layer EL.

Next, a detailed description will be given of the method of erasing and writing the ROM information in the second embodiment by use of a non-volatile information write/erase means (not shown) for carrying out the writing or erasure of the non-volatile information.

Erasing Method:

When erasing the ROM information stored in the memory cell MC11, the confronting electrode CE1 is set to a high positive voltage of 15 [V], for example, the bit line BL1 and the substrate are grounded to 0 [V], and the word line WL1 is set to a predetermined potential to turn ON the transfer transistor T. The storage electrode SE of the storage capacitor C of the memory cell MC11 becomes 0 [V] and the confronting electrode CE1 becomes 15 [V]. Hence, the charge Q is injected from the storage electrode SE to the charge storage layer EL, thereby erasing the ROM information stored in the memory cell MC11.

In this case, the confronting electrode CE2 is grounded together with the word line WL2. By grounding the word line WL2, it is possible to prevent the erroneous erasure of the ROM information stored in the memory cell MC21. In addition, by grounding the confronting electrode CE2, it is possible to prevent the erroneous erasure of the ROM information stored in the memory cells MC12 and MC22.

Therefore, it is possible to selectively erase the ROM information stored in the semiconductor memory device for every one bit.

It is also possible to simultaneously erase the stored ROM information of a plurality of bits by selectively setting the word lines WL1 and WL2 and the confronting electrodes CE1 and CE2 to a high potential, or when the confronting electrode CE is provided in common to a plurality of bit lines BL or to all the bit lines BL.

First Writing Method:

When writing the ROM information into the memory cell MC11, the confronting electrodes CE1 and CE2 are grounded, the bit line BL1 is set to a high positive voltage of 15 [V], for example, and the word line WL1 is set to a high positive voltage to turn ON the transfer transistor T. The storage electrode SE of the storage capacitor C of the memory cell MC11 becomes 15 [V], the confronting electrode CE1 becomes 0 [V], and the charge Q is discharged from the charge storage layer EL to the storage electrode SE, thereby writing the ROM information into the memory cell MC11.

The word line WL is set to the high positive voltage in order to compensate for the voltage drop at the transfer transistor T.

In this case, the bit line BL2 is grounded together with the word line WL2. By grounding the bit line BL2, the memory cell MC21 holds the ROM information which is stored prior to the write operation. In addition, by grounding the word line WL2, the memory cells MC21 and MC22 hole the ROM information which is stored prior to the write operation.

Therefore, it is possible to selectively write the ROM information into the semiconductor memory device for every one bit.

It is also possible to simultaneously write the ROM information for a plurality of bits by selectively setting the word lines WL1 and WL2 and the confronting electrodes CE1 and CE2 to a high potential.

Second Writing Method:

When writing the ROM information into the memory cell MC11, the confronting electrode CE1 and the substrate are set to a high negative voltage of −15 [V], for example, the bit lines BL1 and BL2 are grounded, and the word line WL1 is set to a predetermined potential to turn ON the transfer transistor T. The storage electrode SE of the storage capacitor C of the memory cell MC11 becomes 0 [V], the confronting electrode CE1 becomes −15 [V], and the charge Q is discharged from the charge storage layer EL to the storage electrode SE, thereby writing the ROM information into the memory cell MC11.

In this case, the confronting electrode CE2 and the word line WL2 are grounded. By grounding the confronting electrode CE2, the memory cells MC12 and MC22 hold the ROM information stored prior to the write operation. In addition, by grounding the word line WL2, the memory cell MC21 holds the ROM information stored prior to the write operation.

Therefore, it is possible to selectively write the ROM information into the semiconductor memory device for every one bit.

It is also possible to simultaneously write the same ROM information to a plurality of bits by selectively setting the confronting electrodes CE1 and CE2 to a high negative potential.

In the case where the substrate is grounded, the storage electrode SE of the memory cell MC21 assumes a negative potential from the floating state due to the effect of the potential at the confronting electrode CE1. Hence, a current flows from the substrate to the storage electrode SE. For this reason, a high voltage is applied across the storage electrode SE and the confronting electrode CE of the memory cell MC21, and a charge is discharged from the charge storage layer EL to the storage electrode SE thereby causing an erroneous write operation.

According to the erasing and writing methods described above, the injection and discharge of the charge Q occurs between the storage electrode SE and the charge storage layer EL. However, the erase and write operations may be carried out similarly by injecting and discharging the charge Q between the confronting electrode CE and the charge storage layer EL.

Figure 14:
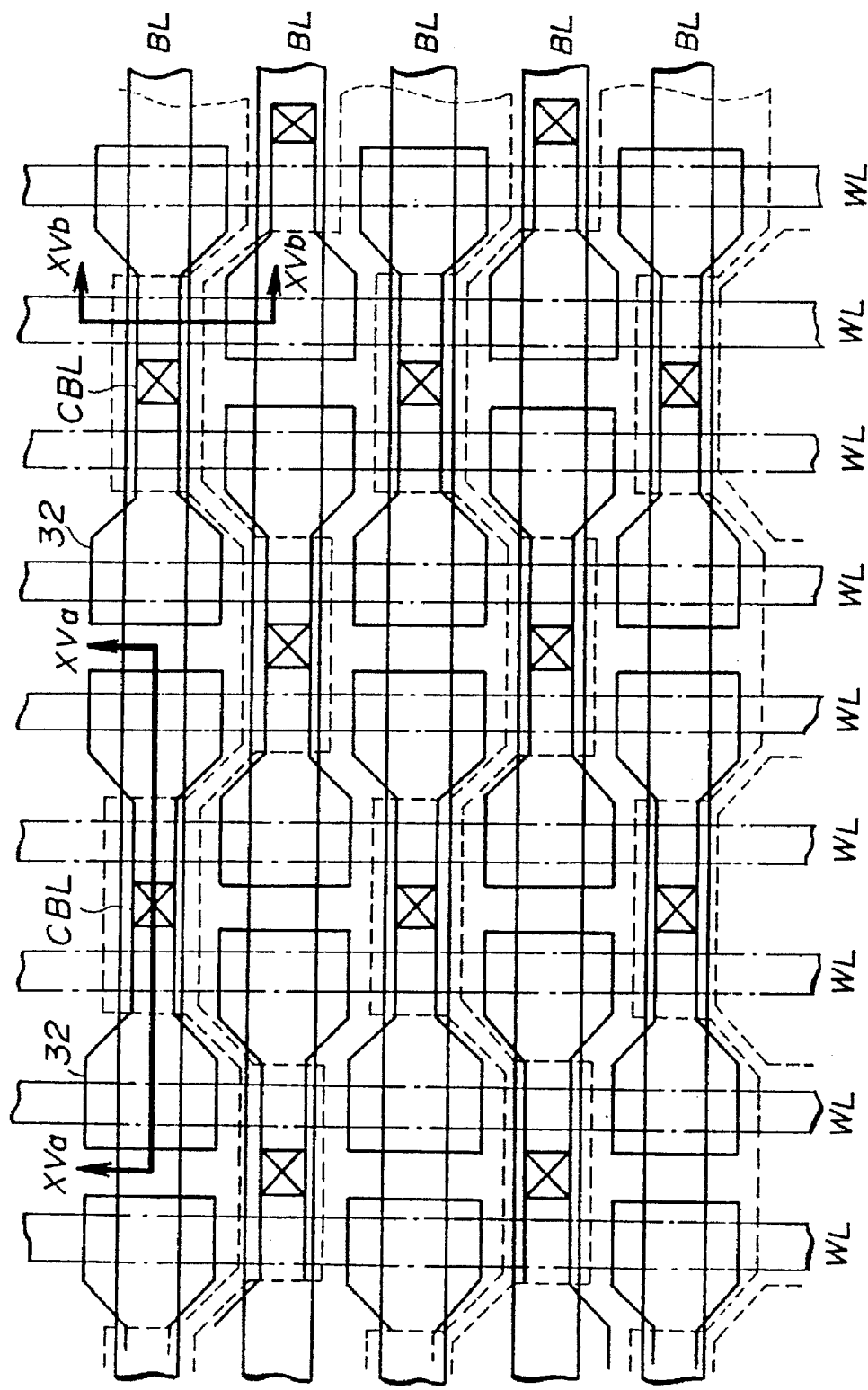
FIG. 14 is a plan view showing an essential part of the second embodiment.
Figure 15A:
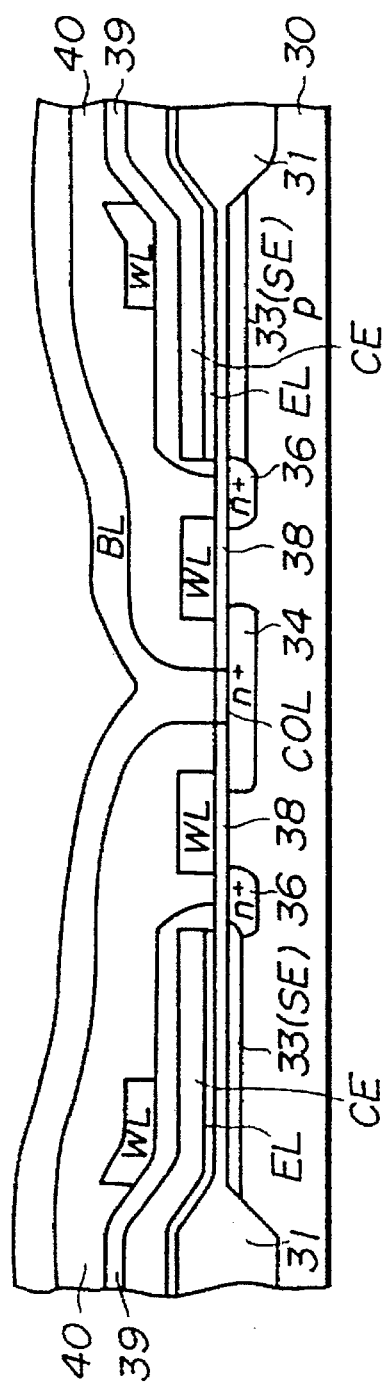
FIGS. 15A and 15B are cross sectional views showing an essential part of the second embodiment.
Figure 15B:
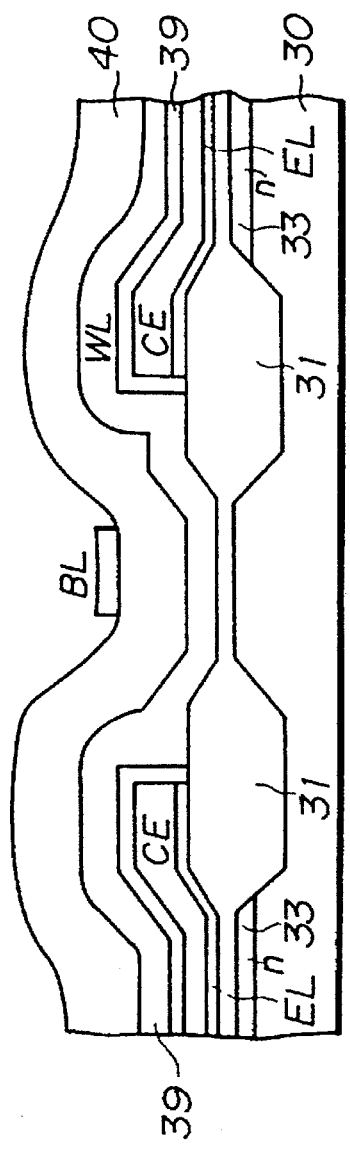

Detailed Structure:

A more detailed description will be given of the second embodiment of the semiconductor memory device, by referring to FIGS. 14 and 15. FIG. 14 shows a plan view of an essential part of the second embodiment, FIG. 15A shows a cross section along a line XVa—XVa in FIG. 14, and FIG. 15B shows a cross section along a line XVb—XVb in FIG. 14.

In this embodiment, the storage electrode SE of the storage capacitor C is formed on the substrate surface with a planar shape, and the charge storage layer EL has a trap characteristic for trapping a large charge.

The semiconductor memory device shown in FIG. 14 realizes the basic structure shown in FIG. 13, but in the layout shown in FIG. 14, the confronting electrode CE is isolated for every two bit lines BL.

In an active region 32 which is isolated by a field oxide layer 31 on the surface of a semiconductor substrate 30, there is formed an n-type impurity region 33 which functions as the storage electrode SE and a source region 34 and a drain region 36 of the transfer transistor T. The n-type impurity region 33 is formed by ion implantation of P ions with a dosage of $1\times10^{13}$ cm$^{-2}$ for example and this n-type impurity region 33 is connected to the drain region 36 of the transfer transistor T.

The confronting electrode CE is formed on the n-type impurity region 33 via the charge storage layer EL. The confronting electrode CE is made of a polysilicon layer, and impurities with a concentration of at least $10^{21}$ cm$^{-3}$ for example, is added to the polysilicon layer by a thermal diffusion using POCl$_3$ as the source.

The charge storage layer EL of this embodiment has a trap characteristic for trapping a large charge. For example, a two-layer structure made up of SiN/SiO$_2$ layer and a three-layer structure made up of SiO$_2$/SiN/SiO$_2$ layer are examples of a multi-layer structure which realizes the trap characteristic for trapping a large charge. The storage capacitor C is formed by the n-type impurity region 33 (storage electrode SE), the charge storage layer EL and the confronting electrode CE. When the charge storage layer EL is made up of a layer having the trap characteristic for trapping a large charge, it is unnecessary to form a tunnel oxide layer.

The word line WL which selects the memory cell shown in cross section is formed between the source region 34 and the drain region 36 of the transfer transistor T via a gate oxide layer 38. The word line WL which selects the other memory cell is formed on the confronting electrodes CE via an oxide layer 39.

The bit line BL is formed on the word line WL via a PSG layer 40 which covers the entire surface. The bit line BL makes contact with the source region 34 (bit line contact CBL) via a contact hole which is formed in the PSG layer 40.

Production Method:

Next, a description will be given of a method of producing the second embodiment, by referring to FIGS. 16A through 16E. In each of FIGS. 16A through 16E, the right hand side shows the cross section taken along the line XVa—XVa in FIG. 14 and the left hand side shows the cross section taken along the line XVb—XVb in FIG. 14.

Figure 16A:
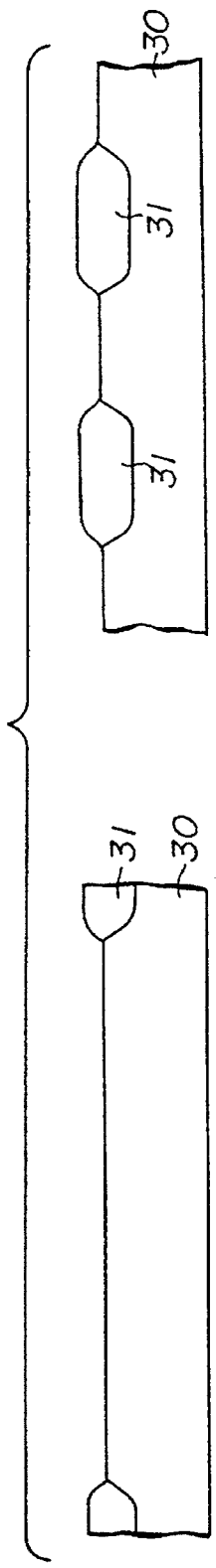

First, the surface of the semiconductor substrate 30 is selectively oxidized to form the field oxide layer 31 and define the active region 32 as shown in FIG. 16A.

Figure 16B:
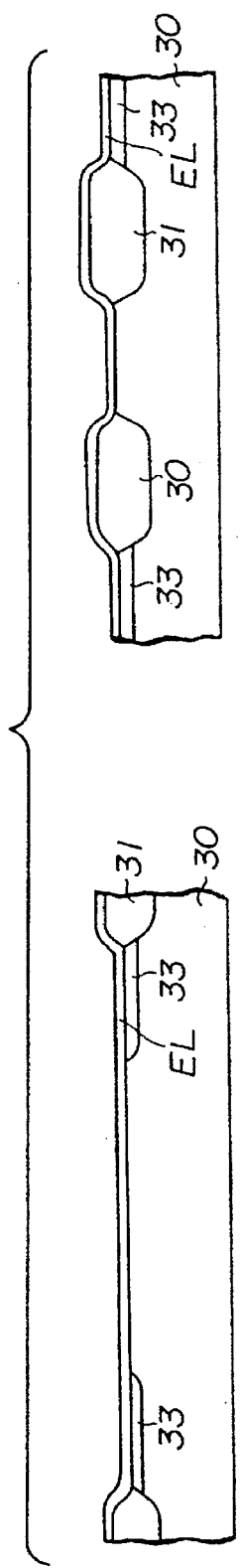

Then, P ions are implanted into the surface of the active region 32 with a dosage of $1\times10^{13}$ cm$^{-2}$, for example, in a region where the storage electrode SE is to be formed, and the n-type impurity region 33 is formed by this ion implantation as shown in FIG. 16B. Of source, it is not essential to implant P ions. Thereafter, a SiO$_2$ layer, a SiN layer and a SiO$_2$ layer are successively formed to form the charge storage layer EL.

Figure 16C:
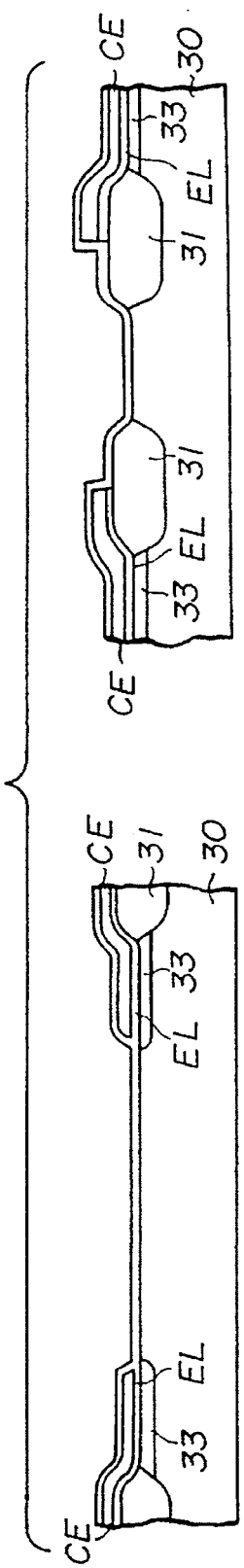

Next, a polysilicon layer is formed and thereafter patterned to form the confronting electrode CE as shown in FIG. 16C. This polysilicon layer is formed into an n$^+$-type polysilicon layer by adding impurities with a dosage of at least $10^{21}$ cm$^{-2}$, for example, by a thermal diffusion using POCl$_3$ as the source. In addition, a thermal oxidation is made to form the gate oxide layer 38 on the surface of the active region 32.

Next, a polysilicon layer is formed and patterned to form the word line WL as shown in FIG. 16D. Within the active region 32, the word line WL is formed as the gate electrode via the gate oxide layer 38, and the word line WL is formed on the oxide layer 39 in other regions. Then, the word line WL which forms the gate electrode is used as a mask when carrying out an ion implantation to form the source region 34 and the drain region 36 as shown in FIG. 16D.

After forming the PSG layer 40, a contact hole is formed in a region where the bit line contact CBL is to be made to make a contact with the source region 34. In addition, a polysilicon layer is formed and patterned to form the bit line BL as shown in FIG. 16E, and the production of the semiconductor memory device ends.

Figure 17:
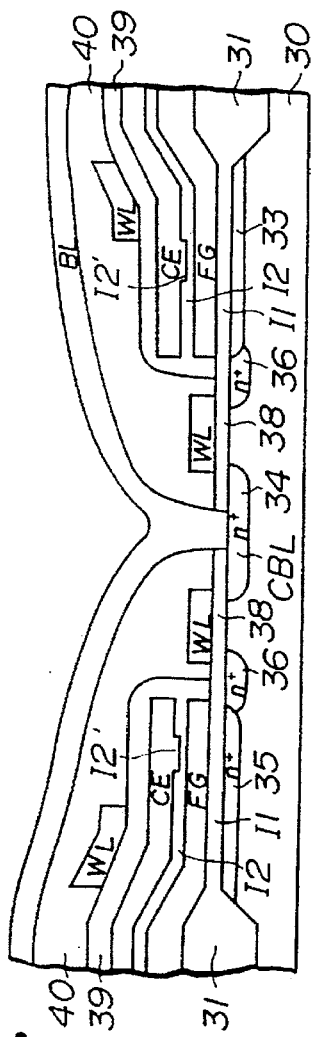
FIG. 17 is a cross sectional view showing an essential part of a modification of the second embodiment.

Modification of Structure:

FIG. 17 shows a modification of the second embodiment along a line XVa—XVa shown in FIG. 14. This modification uses a planar type storage capacitor C in which the floating gate FG is used for the charge storage layer EL. In FIG. 17, those parts which are the same as those corresponding parts in FIGS. 15A and 15B are designated by the same reference numerals, and a description thereof will be omitted.

In this modification, the floating gate FG which is made up of an n$^+$-type polysilicon layer is formed between the confronting electrode CE and the storage electrode SE which is made up of the n-type impurity region 33. Similarly to the confronting electrode CE, the n$^+$-type polysilicon layer of the floating gate FG is formed by adding impurities with a dosage of of at least $10^{21}$ cm$^{-2}$, for example, by a thermal diffusion using POCl$_3$ as the source.

The insulator layer I1 is formed between the storage electrode SE and the floating gate FG, and the insulator layer I2 is formed between the floating gate FG and the confronting electrode CE. A portion of the insulator layer I2 is made thin to form the tunnel insulator layer portion I2' for facilitating the flow of tunnel current.

Figure 18:
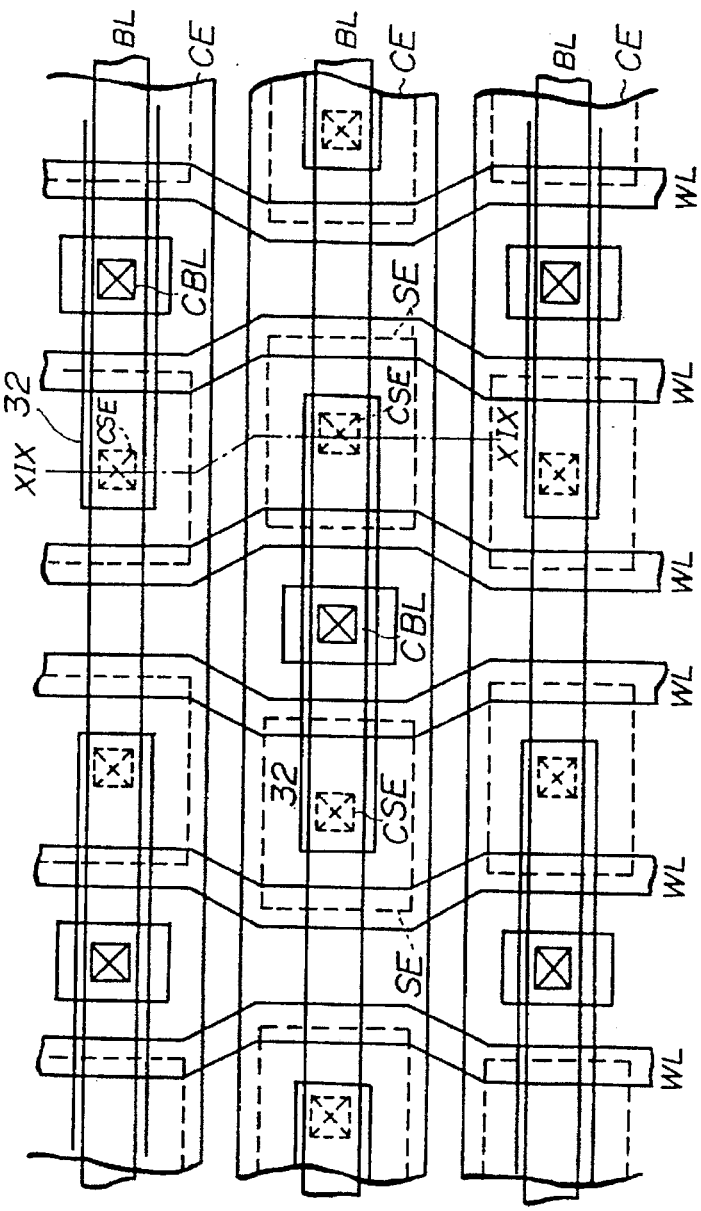
FIG. 18 is a plan view showing an essential part of a third embodiment of the semiconductor memory device according to the present invention.

Third Embodiment:

Next, a description will be given of a third embodiment of the semiconductor memory device according to the present invention, by referring to FIGS. 18 and 19. FIG. 18 shows a plan view of an essential part of the third embodiment, and FIGS. 19A through 19C show cross sections along a line XIX—XIX in FIG. 18. In FIGS. 18 and 19, those parts which are the same as those corresponding parts in FIGS. 14 through 16 are designated by the same reference numerals, and a description thereof will be omitted.

In this third embodiment, the confronting electrode CE is isolated for every bit line BL similarly as in the case of the first embodiment. However, this third embodiment differs from the first embodiment in that the storage electrode SE of the storage capacitor C is a stacked type formed on the semiconductor substrate 30. As opposed to the first embodiment, in the third embodiment the bit lines are above the capacitor structures in FIGS. 19A–19C as opposed to below in FIGS. 11A–11B.

FIGS. 19A through 19C show various embodiments of the stacked type storage capacitor C.

In the embodiment shown in FIG. 19A, the n-type polysilicon layer making up the storage electrode SE is formed on the semiconductor substrate 30, and makes contact to the drain region 36 at a storage contact CSE. The charge storage layer EL which has the trap characteristic for trapping a large charge is formed on the surface of the storage electrode SE, and the confronting electrode CE is formed on the charge storage layer EL. The PSG layer 40 is formed on the confronting electrode CE, and the bit line BL is formed on the PSG layer 40.

In the embodiment shown in FIG. 19B, the charge storage layer EL and the confronting electrode CE are formed using the same mask in FIG. 19B, so that the charge storage layer EL and the confronting electrode CE have the same size as the storage electrode SE.

In the embodiment shown in FIG. 19C, the confronting electrode CE is isolated for every two bit lines BL, similarly as in the case of the second embodiment.

Figure 20:
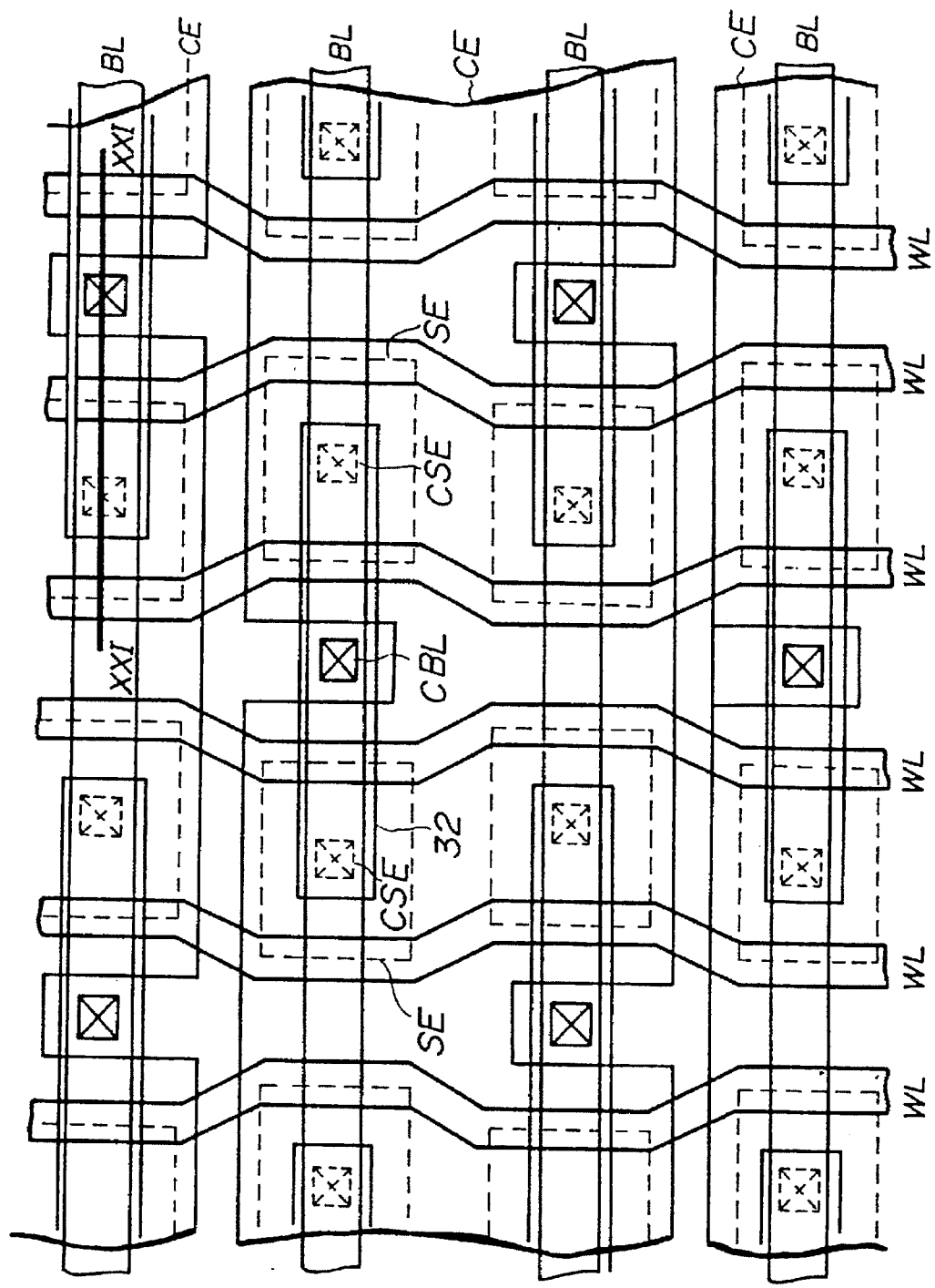
FIG. 20 is a plan view showing an essential part of a fourth embodiment of the semiconductor memory device according to the present invention.

Fourth Embodiment:

Next, a description will be given of a fourth embodiment of the semiconductor memory device according to the present invention, by referring to FIGS. 20 and 21. FIG. 20 shows a plan view of an essential part of the fourth embodiment, and FIGS. 21A and 21B show cross sections along a line XXI—XXI in FIG. 20. In FIGS. 21 and 21, those parts which are the same as those corresponding parts in FIGS. 14 through 19 are designated by the same reference numerals, and a description thereof will be omitted.

In this fourth embodiment, the confronting electrode CE is isolated for every two bit lines BL similarly as in the case of the second embodiment. However, this fourth embodiment differs from the second embodiment in that the storage capacitor C is a stacked type.

FIGS. 21A and 21B show various embodiments of the stacked type storage capacitor C.

In the embodiment shown in FIG. 21A, the storage electrode SE is made of an n-type polysilicon layer which is formed on an oxide layer 42 covering the word line WL. The storage electrode SE makes contact with the drain region 36 at a storage contact CSE via contact holes which are formed in the oxide layer 42 and the gate oxide layer 38. The charge storage layer EL which has the trap characteristic for trapping a large charge is formed on the surface of the storage electrode SE, and the confronting electrode CE is formed on the charge storage layer EL. The PSG layer 40 is formed on the confronting electrode CE, and the bit line BL is formed on the PSG layer 40. The bit line BL makes contact with the source region 34 at a bit contact CBL.

In the embodiment shown in FIG. 21B, the floating gate FG is used for the charge storage layer EL. Similarly to the confronting electrode CE, the n$^+$-type polysilicon layer of the floating gate FG is formed by adding impurities with a dosage of of at least $10^{21}$ cm$^{-2}$, for example, by a thermal diffusion using POCl$_3$ as the source.

The insulator layer I1 is formed between the storage electrode SE and the floating gate FG, and the insulator layer I2 is formed between the floating gate FG and the confronting electrode CE. A portion of the insulator layer I2 is made thin so as to form the tunnel insulator layer portion I2' for facilitating the flow of tunnel current.

Figure 22:
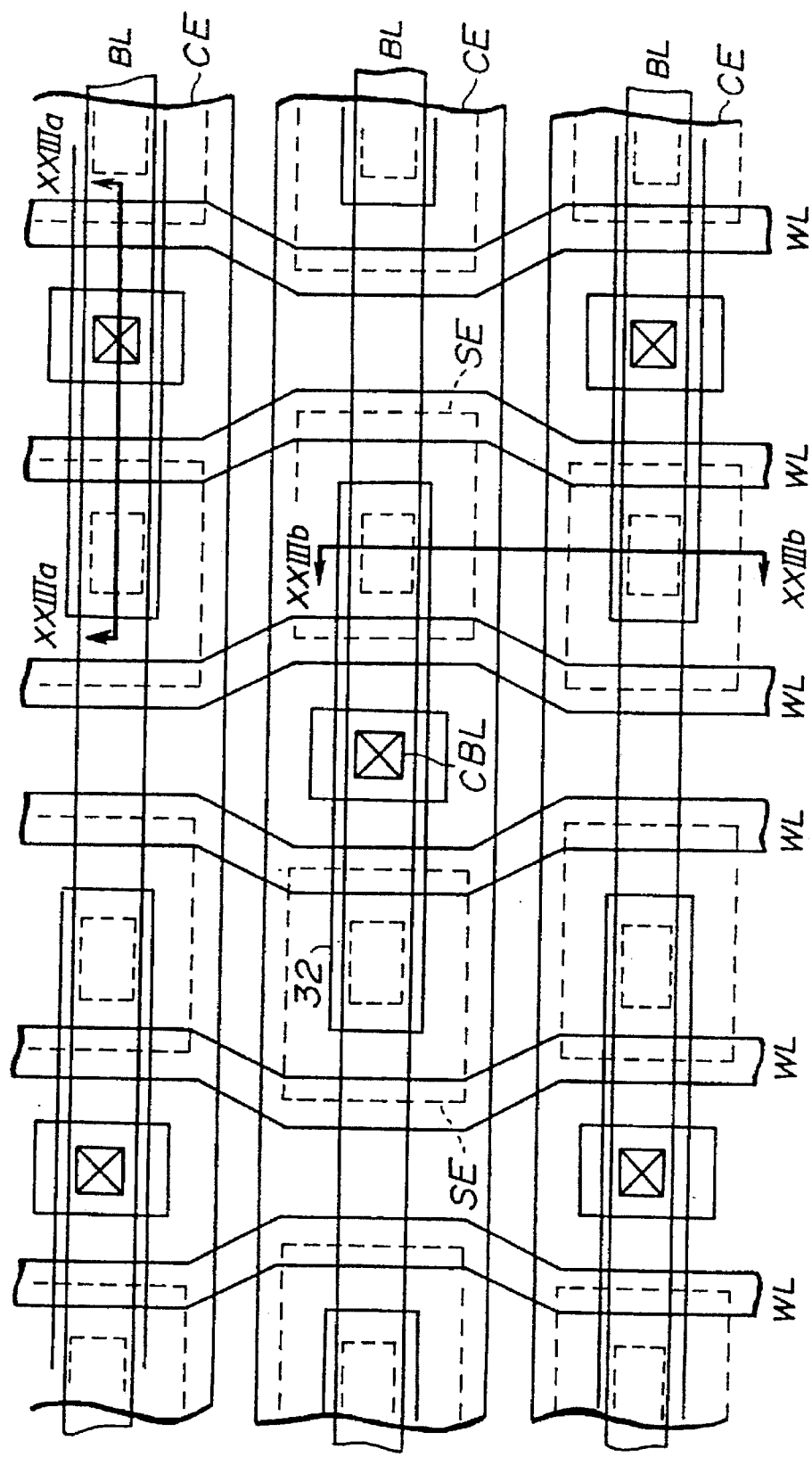
FIG. 22 is a plan view showing an essential part of a fifth embodiment of the semiconductor memory device according to the present invention.
Figure 23:
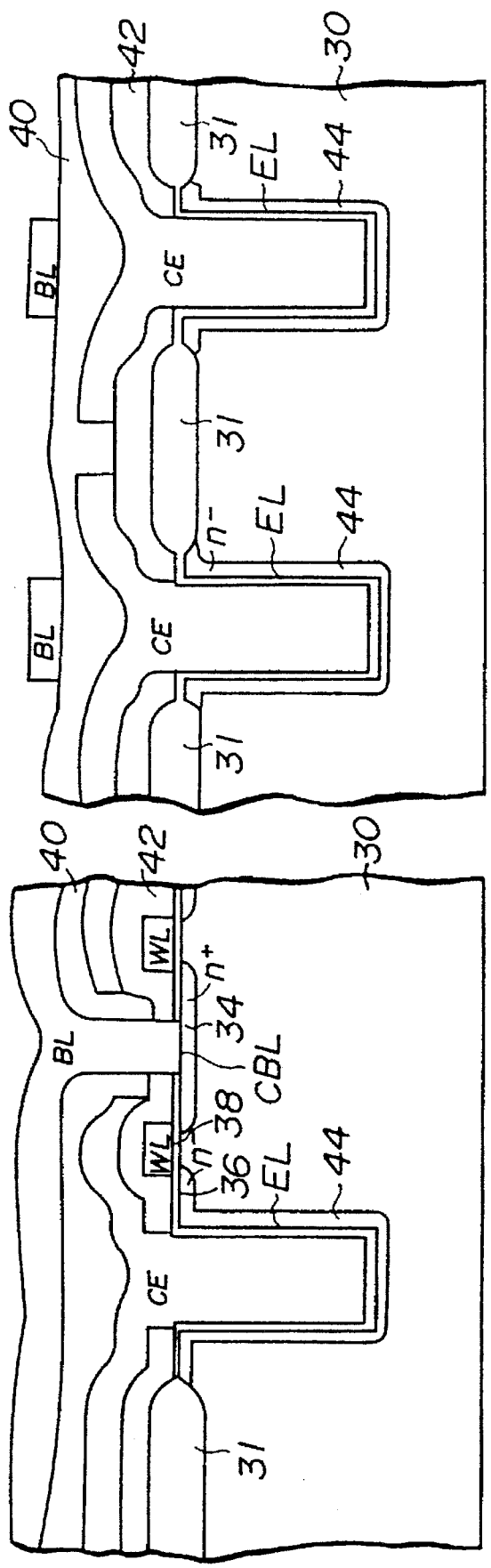
FIGS. 23A and 23B are cross sectional views showing an essential part of the fifth embodiment.

Fifth Embodiment:

Next, a description will be given of a fifth embodiment of the semiconductor memory device according to the present invention, by referring to FIGS. 22 and 23. FIG. 22 shows a plan view of an essential part of the fifth embodiment, FIG. 23A shows a cross section along a line XXIa—XXIa in FIG. 22, and FIG. 23B shows a cross section along a line XXIb—XXIb in FIG. 22. In FIGS. 22 and 23, those parts which are the same as those corresponding parts in FIGS. 14 through 21 are designated by the same reference numerals, and a description thereof will be omitted.

In this fifth embodiment, the confronting electrode CE is isolated for every bit line BL similarly to the first embodiment. However, this fifth embodiment differs from the first embodiment in that the storage electrode SE of the storage capacitor C is a trench type formed within a groove of the semiconductor substrate 30.

A groove is formed in the active region 32 which is isolated by the field oxide layer 31 on the surface of the semiconductor substrate 30. An n-type impurity region 44 which functions as the storage electrode SE is formed on the inner surface of this groove. At the same time, the source region 34 and the drain region 36 of the transfer transistor T are formed in the active region 32. The n-type impurity region 44, that is, the storage electrode SE, is connected to the drain region 36 of the transfer transistor T.

The charge storage layer EL is formed within the groove on the n-type impurity region 44 which forms the storage electrode SE. The confronting electrode CE fills the groove and also extends to the periphery of the groove.

In this embodiment, a large storage capacitance C can be realized within a small area due to the trench structure.

Sixth Embodiment:

Next, a description will be given of a sixth embodiment of the semiconductor memory device according to the present invention, by referring to FIGS. 24 and 25.

Figure 24:
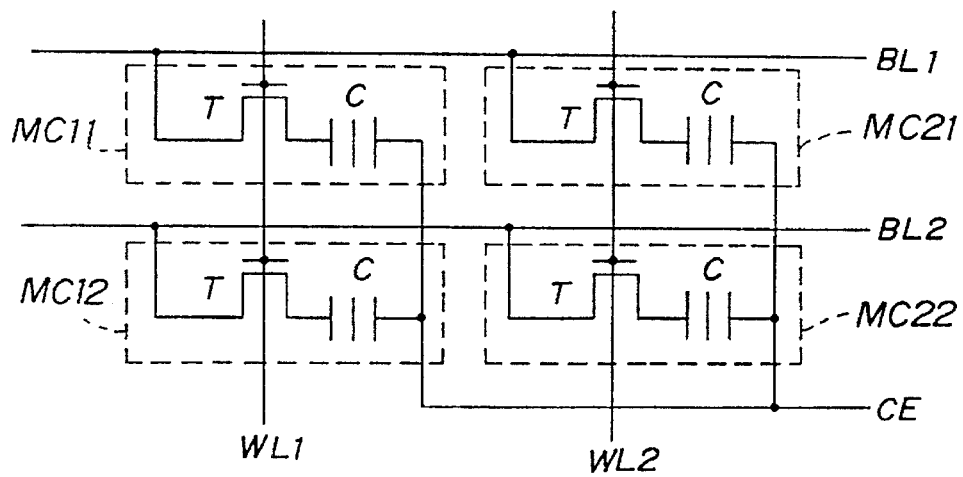
FIG. 24 shows an essential part of a layout of a sixth embodiment of the semiconductor memory device according to the present invention.

Basic Structure:

The basic structure of this sixth embodiment is shown in concept in FIG. 24.

The word lines WL1, WL2, . . . run vertically, and the bit lines BL1, BL2, . . . run horizontally. The memory cells MC11, MC12, . . . are arranged at intersections of the corresponding word lines WL1, WL2, . . . and bit lines BL1, BL2, . . . A sense amplifier (not shown) is connected to the bit lines BL1, BL2, . . . to detect the potential thereof.

The confronting electrode CE is provided in common to all of the bit lines BL1, BL2, . . . and the confronting electrode CE is not isolated as in the case of the basic structure shown in FIG. 13.

Each of the memory cells MC11, MC12, ... are formed by the storage capacitor C for storing information and the transfer transistor T for reading and writing the information. The gate of the transfer transistor T is connected to the word line WL. The source of the transfer transistor T is connected to the bit line BL. The drain of the transfer transistor T is connected to the storage electrode SE of the storage capacitor C.

In the storage capacitor C, the charge storage layer EL is inserted between the storage electrode SE and the confronting electrode CE. The RAM information is stored in the storage capacitor C, and the ROM information is stored by injecting the charge Q into the charge storage layer EL.

Next, a detailed description will be given of the methods of erasing and writing the ROM information by a non-volatile information write/erase means (not shown) for writing/erasing the non-volatile information.

Erasing Method:

When erasing the ROM information, the confronting electrode CE is set to a high positive voltage of 15 [V], for example, the bit lines BL1 and BL2 and the substrate are grounded to 0 [V], and the word line WL1 is set to a predetermined potential so as to turn ON the transfer transistor T. In the memory cells MC11 and MC12, the storage electrode SE of the storage capacitor C becomes 0 [V], the confronting electrode CE becomes 15 [V], and the charge Q is injected from the storage electrode SE to the charge storage layer EL, thereby erasing the ROM information.

In this case, the word line WL2 is grounded. By grounding the word line WL2, the transfer transistor is turned OFF so as to prevent an erroneous erasure of the ROM information stored in the memory cells MC21 and MC22.

Therefore, the ROM information stored in the semiconductor memory device can be selectively erased for each word line WL.

It is of course possible to simultaneously erase all bits by setting all of the word lines WL1, WL2, ... to a high potential.

Writing Method:

When writing the ROM information into the memory cell MC11, the confronting electrode CE and the substrate are grounded, the bit line BL1 is set to a high positive voltage of 15 [V], for example, and the word line WL1 is set to a high positive voltage so as to turn ON the transfer transistor T. The storage electrode SE of the storage capacitor C of the memory cell MC11 becomes 15 [V], the confronting electrode CE becomes 0 [V], and the charge Q is discharged from the charge storage layer EL to the storage electrode SE, thereby writing the ROM information into the memory cell MC11.

The word line WL is set to the high positive voltage in order to compensate for the voltage drop which occurs at the transfer transistor T.

In this case, the bit line BL2 is grounded together with the word line WL2. By grounding the bit line BL2, the memory cell MC21 holds the ROM information stored prior to the write operation. In addition, by grounding the word line WL2, the memory cells MC21 and MC22 hold the ROM information stored prior to the write operation.

Therefore, the ROM information can be selectively written into the semiconductor memory device for every bit.

According to the erasing and writing methods described above, the injection and discharge of the charge Q takes place between the storage electrode SE and the charge storage layer EL. However, the injection and discharge of the charge Q may similarly take place between the confronting electrode CE and the charge storage layer EL.

Figure 25:
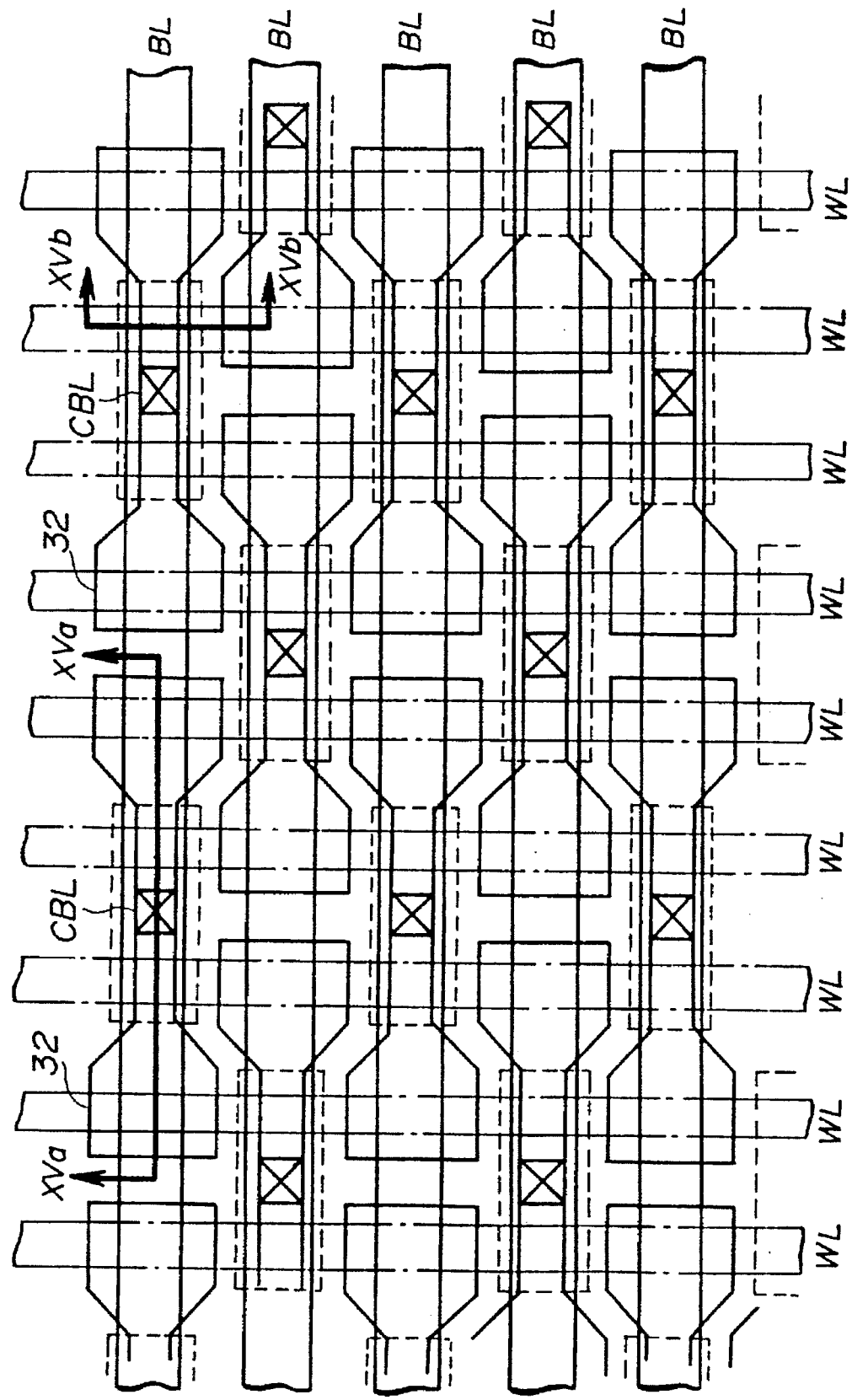
FIG. 25 is a plan view showing an essential part of the sixth embodiment.

Detailed Structure:

FIG. 25 shows the details of an essential part of this embodiment. In FIG. 25, those parts which are the same as those corresponding parts in FIG. 14 are designated by the same reference numerals, and a description thereof will be omitted.

As shown in FIG. 25 which shows the structure of the sixth embodiment in the plan view, the confronting electrode CE is provided in common to all the bit lines BL, but the other parts are basically the same as the second embodiment shown in FIG. 14. In this sixth embodiment, the cross sections along lines XVa—XVa and XVb—XVb in FIG. 25 respectively are the same as the cross sections shown in FIGS. 15A and 15B.

Seventh Embodiment:

Next, a description will be given of a seventh embodiment of the semiconductor memory device according to the present invention, by referring to FIG. 26. This embodiment employs the folded bit line system in which two bit lines are folded.

Figure 26:
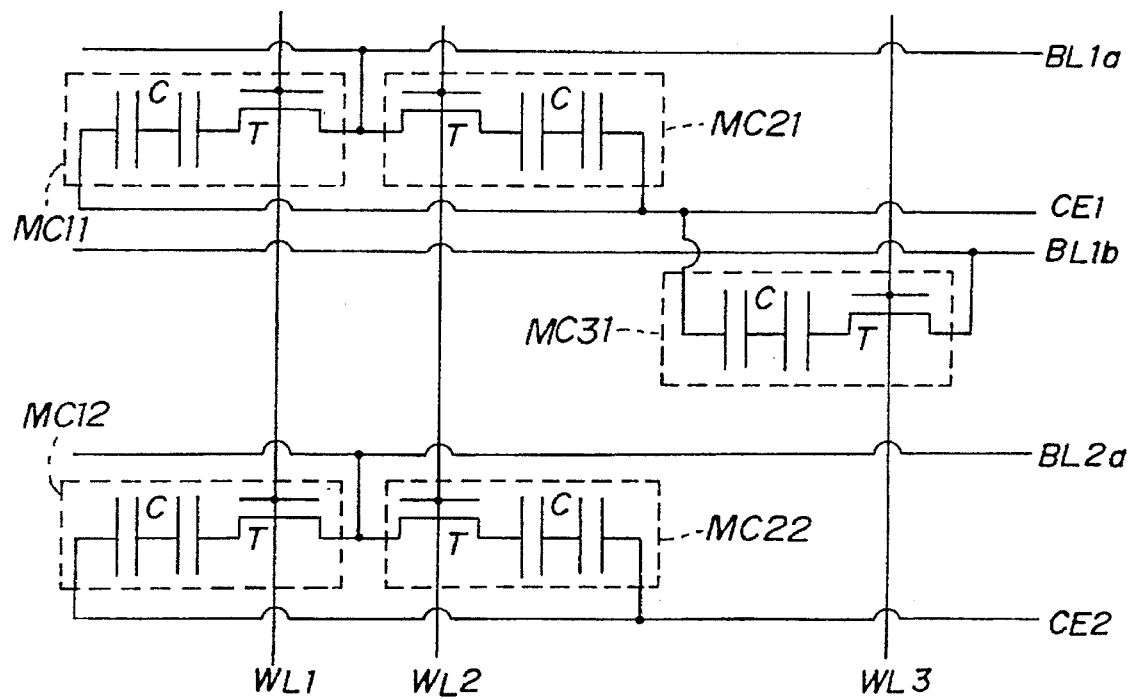
FIG. 26 shows a layout of an essential part of a seventh embodiment of the semiconductor memory device according to the present invention.

The memory cells MC11, MC12, ... are arranged with a layout shown in FIG. 26. The word lines WL1, WL2, ... run vertically, and the bit lines BL1a, BL1b, BL2a, BL2b, ... run horizontally. The confronting electrode CE1, CE2, ... are arranged in the horizontal direction. The confronting electrodes CE1, CE2, ... are isolated for each of the bit line pairs BL1a and BL1b, BL2a and BL2b, ... The memory cells MC11, MC12, ... are arranged at intersections of the corresponding word lines CL1, CL2, ... and bit line pairs BL1a and BL1b, BL2a and BL2b, ... Each of the bit line pairs BL1a and BL1b, BL2a and BL2b, ... are connected to a sense amplifier (not shown).

Each of the memory cells MC11, MC12, ... are formed by the storage capacitor C for storing information and a transfer transistor T for reading and writing the information. The gate of the transfer transistor T is connected to the word line WL. The gate of the transfer transistor T is connected to the bit line BL. The drain of the transfer transistor T is connected to the storage electrode SE of the storage capacitor C.

Figure 27:
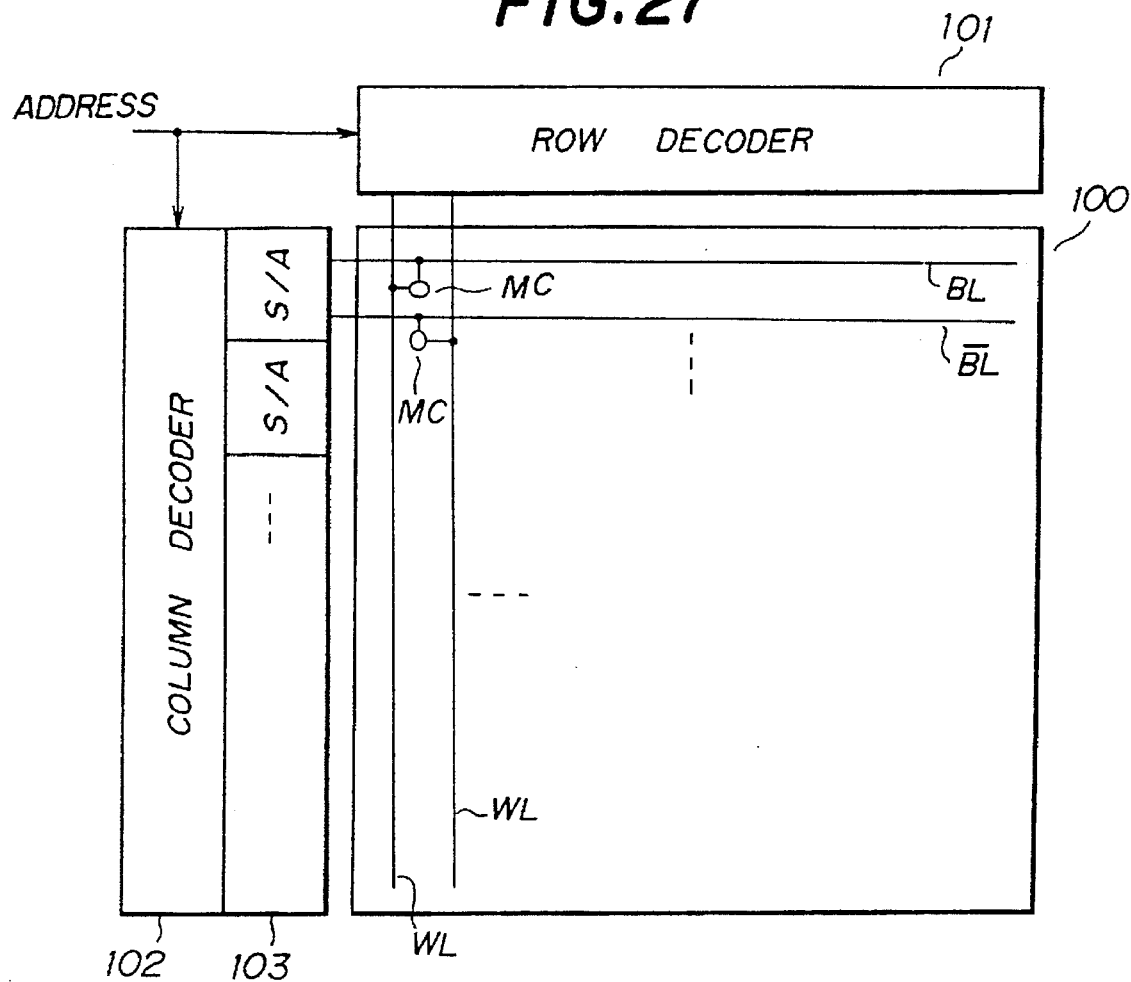
FIG. 27 is a system block diagram showing the general construction of the semiconductor memory device according to the present invention.

In the description given heretofore, only the essential part of the semiconductor memory device is shown and described. FIG. 27 shows a general construction of the semiconductor memory device to which the present invention may be applied. The semiconductor memory device shown in FIG. 27 includes a memory cell array 100, a row decoder 101, a column decoder 102 and a sense amplifier part 103. The row decoder 101 selects the word line WL in response to an address signal, and the column decoder 102 selects the bit line BL (and $\overline{BL}$) in response to the address signal. The sense amplifier is made up of a plurality of sense amplifiers respectively provided for each bit line pair BL and $\overline{BL}$. The memory cells of the memory cell array 100 are denoted by MC.

Figure 28:
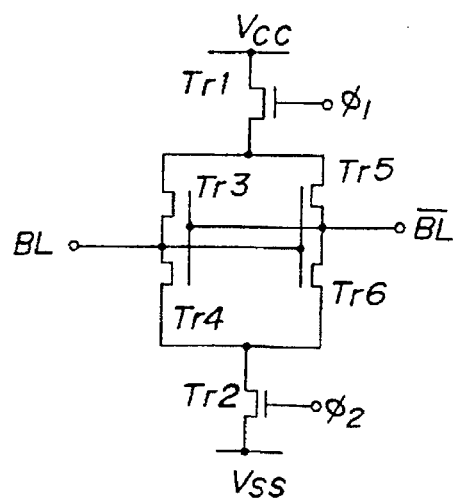
FIG. 28 is a circuit diagram showing an essential part of a sense amplifier shown in FIG. 27.

FIG. 28 shows the sense amplifier which forms a part of the sense amplifier part 103. The sense amplifier includes transistors Tr1 through Tr6 which are connected as shown. For example, the transistors Tr3 and Tr5 are p-channel transistors and the transistors Tr4 and Tr6 are n-channel transistors. The transistors Tr1 and Tr2 are respectively controlled by signals $\phi 1$ and $\phi 2$. For example, Vcc is 5 [V] and Vss is 0 [V], and the potential difference between the bit lines BL and $\overline{BL}$ is amplified by this sense amplifier.

Figure 29:
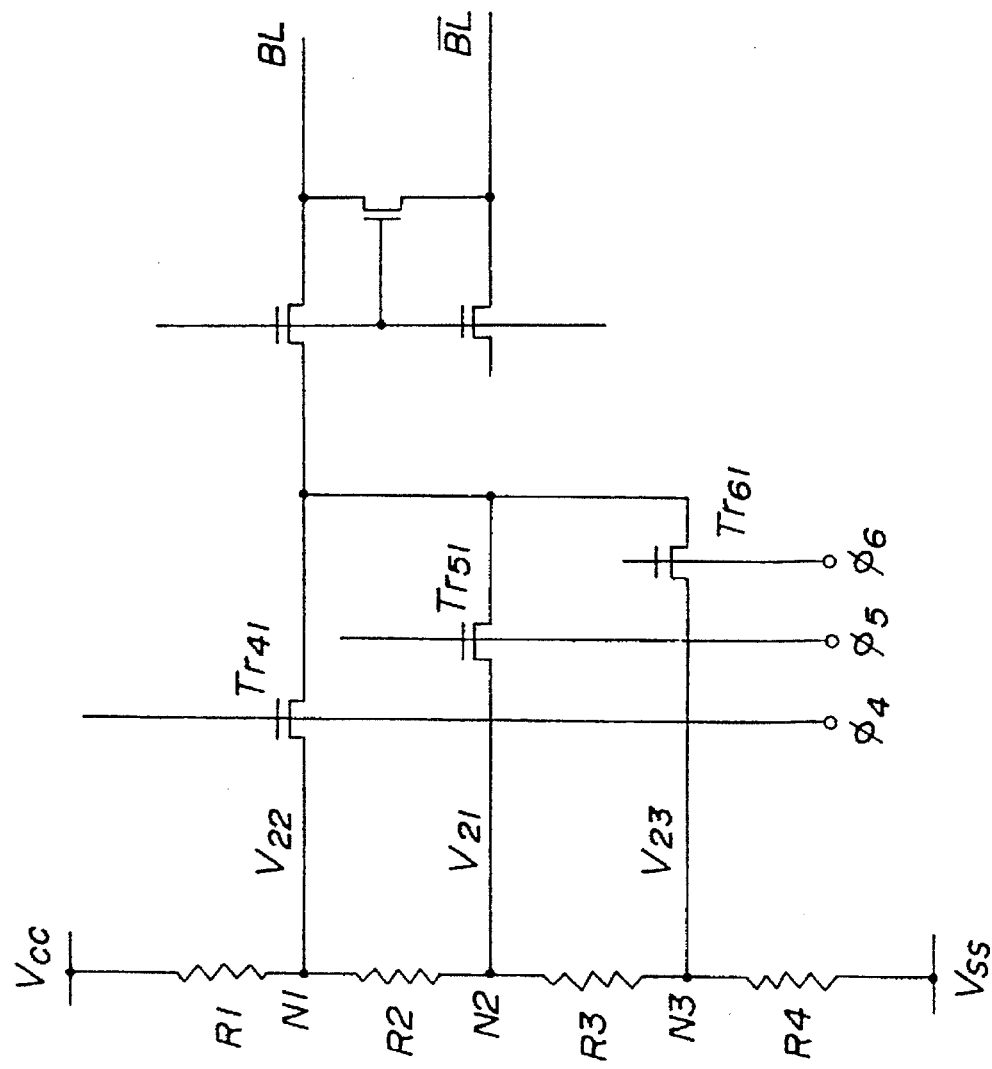
FIG. 29 is a circuit diagram showing an essential part of an embodiment of a precharge circuit for generating various precharge voltages used in the present invention.

FIG. 29 shows an embodiment of a precharge circuit for generating various precharge voltages which are used in the present invention. Resistors R1 through R4 are connected in series between power source voltages Vcc and Vss, where Vcc is 5 [V] and Vss is 0 [V], for example. A voltage $V_{22}$ is obtained at a node N1, a voltage $V_{21}$ is obtained at a node N2, and a voltage $V_{23}$ is obtained at a node N3. Transistors Tr41, Tr51 and Tr61 are respectively controlled by signals $\phi 4$, $\phi 5$ and $\phi 6$. Hence, when operating the semiconductor memory device in a mode described above in conjunction with FIG. 5B, for example, the signal $\phi 5$ is turned ON (high level) and the signals $\phi 4$ and $\phi 6$ are turned OFF (low level) so that the bit line BL is precharged to the voltage $V_{21}$.

In the described embodiments, any known dynamic refresh means may be employed to carry out the refresh operation. In addition, the confronting electrode of the storage capacitor may be used in common for all of the memory cells of the memory cell array.

Further, the present invention is not limited to these embodiments, but various variations and modifications may be made without departing from the scope of the present invention.

What is claimed is:

1. A memory cell which is connected to a word line and a bit line, said memory cell comprising:

a transfer transistor having a gate connected to the word line, a first electrode connected to the bit line, and a second electrode;

a storage capacitor having a capacitance changing with a hysteresis curve, said storage capacitor including a storage electrode connected to the second electrode of said transfer transistor, a confronting electrode, and a charge storage layer disposed between the storage electrode and the confronting electrode and being substantially equidistant from the confronting electrode, said charge storage layer having a substantially uniform thickness and having a side edge substantially coextensive with a side edge of the storage electrode; and means for applying a bias voltage across the storage electrode and the confronting electrode, to determine the capacitance at one of two values, the memory cell thereby being capable of storing both volatile and non-volatile information independently of each other so that the volatile information and the non-volatile information are respectively read from the memory cell in response to mutually different bias voltage values.

2. The memory cell as claimed in claim 1, wherein the storage electrode of said storage capacitor is made of a semiconductor having a first impurity density, and the confronting electrode of said storage capacitor is made of a semiconductor having a second impurity density which is higher than the first impurity density.

3. The memory cell as claimed in claim 1, wherein the capacitance of said storage capacitor is changed by changing a charge which is stored in the charge storage layer of said storage capacitor.

4. The memory cell as claimed in claim 1, wherein the charge storage layer of said storage capacitor includes a floating gate which confronts the storage electrode via a first insulator layer and confronts the confronting electrode via a second insulator layer, a tunnel insulator layer portion being formed in at least a portion of one of the first and second insulator layers for injecting a charge into the floating gate.

5. The memory cell as claimed in claim 1, wherein the charge storage layer of said storage capacitor has a trap characteristic for trapping a large charge.

6. The memory cell as claimed in claim 5, wherein the charge storage layer of said storage capacitor includes a SiN layer and a $SiO_2$ layer which is formed on the SiN layer.

7. The memory cell as claimed in claim 1, which further comprises a semiconductor substrate on which said transfer transistor and said storage capacitor are formed, and the storage electrode of said storage capacitor is an impurity region formed on a surface of said semiconductor substrate.

8. The memory cell as claimed in claim 1, which further comprises a semiconductor substrate on which said transfer transistor and said storage capacitor are formed, and the storage electrode of said storage capacitor is a semiconductor layer which is formed on said semiconductor substrate via an insulator layer.

9. The memory cell as claimed in claim 8, wherein the semiconductor layer is made of polysilicon.

10. The memory cell as claimed in claim 1, which further comprises a semiconductor substrate on which said transfer transistor and said storage capacitor are formed, and the storage electrode of said storage capacitor is an impurity region formed on an inner surface of a groove which is formed in said semiconductor substrate.

11. The memory cell as claimed in claim 1, wherein a charge is stored in said storage capacitor to write an arbitrary volatile information and the arbitrary volatile information is read out when using the memory cell as a memory cell of a random access memory, and a charge is injected into the charge storage layer to write an arbitrary non-volatile information and the arbitrary non-volatile information is read out when using the memory cell as a memory cell of a read only memory.

12. The memory cell as claimed in claim 1, wherein a portion of the storage electrode confronting the confronting electrode has an edge which approximately coincides with an edge of the confronting electrode in a plan view of the memory cell.

13. The memory cell as claimed in claim 1, wherein a portion of the charge storage layer confronting the storage electrode has an edge which approximately coincides with an edge of the storage electrode in a plan view of the memory cell.

14. A semiconductor memory device comprising:

a plurality of word lines;

a plurality of bit lines;

a row decoder selecting one of said word lines in response to an address signal;

a column decoder selecting one of said bit lines in response to the address signal;

a sense amplifier, coupled to said bit lines, sensing and amplifying information on said bit lines; and a memory cell array including a plurality of memory cells respectively connected to one of said word lines and to one of said bit lines, each of said memory cells including a transfer transistor having a gate connected to the word line, a first electrode connected to the bit line, and a second electrode;

a storage capacitor having a capacitance changing with a hysteresis curve, said storage capacitor including a storage electrode connected to the second electrode of said transfer transistor, a confronting electrode and a charge storage layer disposed between the storage electrode and the confronting electrode and being substantially equidistant from the confronting electrode, said charge storage layer having a substantially uniform thickness and a side edge substantially coextensive with a side edge of the storage electrode; and means for applying a bias voltage across the storage electrode and the confronting electrode, to determine the capacitance at one of two values, each of the memory cells thereby being capable of storing both volatile and non-volatile information independently of each other so that the volatile information and the non-volatile information are respectively read from the memory cell in response to mutually different bias voltage values.

15. The semiconductor memory device as claimed in claim 14, wherein the storage electrode of said storage capacitor is made of a semiconductor having a first impurity density, and the confronting electrode of said storage capacitor is made of a semiconductor having a second impurity density which is higher than the first impurity density.

16. The semiconductor memory device as claimed in claim 14, wherein the capacitance of said storage capacitor is changed by changing a charge which is stored in the charge storage layer of said storage capacitor.

17. The semiconductor memory device as claimed in claim 14, wherein the charge storage layer of said storage capacitor includes a floating gate which confronts the storage electrode via a first insulator layer and confronts the confronting electrode via a second insulator layer, a tunnel insulator layer portion being formed in at least a portion of one of the first and second insulator layers for injecting a charge into the floating gate.

18. The semiconductor memory device as claimed in claim 14, wherein the charge storage layer of said storage capacitor has a trap characteristic for trapping a large charge.

19. The semiconductor memory device as claimed in claim 18, wherein the charge storage layer of said storage capacitor includes a SiN layer and a $SiO_2$ layer which is formed on the SiN layer.

20. The semiconductor memory device as claimed in claim 14, which further comprises a semiconductor substrate on which said transfer transistor and said storage capacitor are formed, and the storage electrode of said storage capacitor is an impurity region formed on a surface of said semiconductor substrate.

21. The semiconductor memory device as claimed in claim 14, which further comprises a semiconductor substrate on which said transfer transistor and said storage capacitor are formed, and the storage electrode of said storage capacitor is a semiconductor layer which is formed on said semiconductor substrate via an insulator layer.

22. The semiconductor memory device as claimed in claim 21, wherein the semiconductor layer is made of polysilicon.

23. The semiconductor memory device as claimed in claim 14, which further comprises a semiconductor substrate on which said transfer transistor and said storage capacitor are formed, and the storage electrode of said storage capacitor is an impurity region formed on an inner surface of a groove which is formed in said semiconductor substrate.

24. The semiconductor memory device as claimed in claim 14, wherein the confronting electrode of said storage capacitor is isolated for each group of memory cells connected to a common bit line.

25. The semiconductor memory device as claimed in claim 14, wherein the confronting electrode of said storage capacitor is isolated for every plurality of groups of memory cells, each of said groups of memory cells being connected to a common bit line.

26. The semiconductor memory device as claimed in claim 14, wherein the confronting electrode of said storage capacitor is used in common for all of the memory cells of said memory cell array.

27. The semiconductor memory device as claimed in claim 14, wherein an arbitrary volatile information is stored in the memory cell by storing a predetermined charge in said storage capacitor.

28. The semiconductor memory device as claimed in claim 27, which further comprises precharge means for precharging the bit line selected by said column decoder to a predetermined potential, and read means for comparing the potential of the bit line with a reference potential when said transfer transistor of the memory cell is ON and reading out the arbitrary volatile information as a result of the potential comparison.

29. The semiconductor memory device as claimed in claim 14, wherein an arbitrary non-volatile information is stored in the memory cell by injecting a predetermined charge into the charge storage layer of said storage capacitor.

30. The semiconductor memory device as claimed in claim 29, which further comprises precharge means for precharging the bit line selected by said column decoder to a predetermined potential, and read means for injecting a predetermined charge into the charge storage layer of said storage capacitor and comparing the potential of the bit line with a reference potential when said transfer transistor of the memory cell is ON to read out the arbitrary non-volatile information as a result of the potential comparison.

31. The semiconductor memory device as claimed in claim 14, wherein a charge is stored in said storage capacitor when storing a volatile information in the memory cell, and a charge is injected into the charge storage layer of said storage capacitor when storing a non-volatile information.

32. The semiconductor memory device as claimed in claim 14, which further comprises precharge means for precharging the bit line selected by said column decoder to a predetermined potential, first read means for injecting a predetermined charge into the charge storage layer of said storage capacitor and comparing the potential of the bit line with a first reference potential when said transfer transistor of the memory cell is ON to read out a non-volatile information stored in the charge storage layer of said storage capacitor as a result of the potential comparison, and second read means for comparing the potential of the bit line with a second reference potential when said transfer transistor of the memory cell is ON and reading out a volatile information stored in said storage capacitor as a result of the potential comparison.

33. The semiconductor memory device as claimed in claim 14, which further comprises means for applying a first voltage to the confronting electrode, applying a second voltage to the bit line and applying a third voltage to the word line to turn ON said transfer transistor when selectively writing a non-volatile information to the memory cell and erasing a non-volatile information stored in the memory cell.

34. The semiconductor memory device as claimed in claim 33, wherein said second voltage is a ground potential which is smaller that said first voltage.

35. The semiconductor memory device as claimed in claim 33, wherein said first voltage is a ground potential which is smaller that said second voltage.

36. The semiconductor memory device as claimed in claim 14, wherein a portion of the storage electrode confronting the confronting electrode has an edge which approximately coincides with an edge of the confronting electrode in a plan view of the memory cell.

37. The semiconductor memory device as claimed in claim 14, wherein a portion of the charge storage layer confronting the storage electrode has an edge which approximately coincides with an edge of the storage electrode in a plan view of the memory cell.

38. A method of reading volatile information stored in a memory cell connected to a word line and a bit line, the memory cell including a transfer transistor having a gate connected to the word line, a first electrode connected to the bit line, and a second electrode, and a storage capacitor having a storage electrode connected to the second electrode of the transfer transistor, a confronting electrode, and a charge storage layer disposed between the storage electrode and the confronting electrode and being substantially equidistant from the confronting electrode, said charge storage layer having a substantially uniform thickness and a side edge substantially coextensive with a side edge of the storage electrode, said storage capacitor having a capacitance with a hysteresis curve determined by a bias voltage applied across the storage electrode and the confronting electrode, so that the capacitance takes one of two values depending on the bias voltage, the volatile information being stored in the storage capacitor, said method comprising the steps of:

(a) precharging the bit line to a predetermined potential; and (b) comparing the potential of the bit line with a reference potential when the transfer transistor is ON, so that the volatile information is read from the memory cell as a result of the comparison, said memory cell being capable of storing said charge storage layer having a substantially uniform thickness and a side edge substantially coextensive with a side edge of the storage electrode, said storage capacitor having a capacitance with a hysteresis curve determined by a bias voltage applied across the storage electrode and the confronting electrode, so that the capacitance takes one of two values depending on the bias voltage, said non-volatile information being stored in the charge storage layer of the storage capacitor, said method comprising the steps of:

(a) precharging the bit line to a predetermined potential; and (b) injecting a predetermined charge into the charge storage layer of the storage capacitor and comparing the potential of the bit line with a reference potential when the transfer transistor is ON, so that the non-volatile information is read from the memory cell as a result of the comparison, said memory cell being capable of storing both volatile and non-volatile information independently of each other so that the volatile information and the non-volatile information are respectively read from the memory cell in response to mutually different bias voltage values.

39. A method of reading non-volatile information stored in a memory cell connected to a word line and a bit line, the memory cell including a transfer transistor having a gate connected to the word line, a first electrode connected to the bit line, and a second electrode, and a storage capacitor having a storage electrode connected to the second electrode of the transfer transistor, a confronting electrode, and a charge storage layer between the storage electrode and the confronting electrode, the charge storage layer having a substantially uniform thickness and a side edge substantially coextensive with a side edge of the storage electrode, the storage capacitor having a capacitance with a hysteresis curve determined by a bias voltage applied across the storage electrode and the confronting electrode, so that the capacitance takes one of two values a depending on the bias voltage, the non-volatile information being stored in the charge storage layer of the storage capacitor, said method comprising the steps of:

(a) precharging the bit line to a predetermined potential; and (b) injecting a predetermined charge into the charge storage layer of the storage capacitor and comparing the potential of the bit line with a reference potential when the transfer transistor is ON, so that the non-volatile information is read from the memory cell as a result of the comparison, the memory cell being capable of storing independently the volatile information and the non-volatile information.

40. A method of reading information stored in a memory cell connected to a word line and a bit line, the memory cell including a transfer transistor having a gate connected to the word line, a first electrode connected to the bit line, and a second electrode, and a storage capacitor having a storage electrode connected to the second electrode of the transfer transistor, a confronting electrode, and a charge storage layer disposed between the storage electrode and the confronting electrode and being substantially equidistant from the confronting electrode, said charge storage layer having a substantially uniform thickness and a side edge substantially coextensive with a side edge of the storage electrode, said storage capacitor having a capacitance with a hysteresis curve determined by a bias voltage applied across the storage electrode and the confronting electrode, so that the capacitance takes one of two values depending on the bias voltage, said method comprising the steps of:

(a) precharging the bit line to a predetermined potential;

(b) comparing the potential of the bit line with a first reference potential when the transfer transistor is ON, so that volatile information is read from the storage capacitor of the memory cell as a result of the comparison; and (c) injecting a predetermined charge into the charge storage layer of said storage capacitor and comparing the potential of the bit line with a second reference potential different from the first reference potential when the transfer transistor is ON, so that non-volatile information is read from the charge storage layer of the storage capacitor of the memory cell as a result of the comparison, said memory cell being capable of storing both volatile and non-volatile information independently of each other so that the volatile information and the non-volatile information are respectively read from the memory cell in response to mutually different bias voltage values.

41. A method of writing/erasing information stored in a memory cell connected to a word line and a bit line, said memory cell including a transfer transistor having a gate connected to the word line, a first electrode connected to the bit line, and a second electrode, and a storage capacitor having a storage electrode connected to the second electrode of the transfer transistor, a confronting electrode, and a charge storage layer between the storage electrode and the confronting electrode and being substantially equidistant from the confronting electrode, said charge storage layer having a substantially uniform thickness and a side edge substantially coextensive with a side edge of the storage electrode, said storage capacitor having a capacitance with a hysteresis curve determined by a bias voltage applied across the storage electrode and the confronting electrode, so that the capacitance takes one of two values depending on the bias voltage, said method comprising the steps of:

(a) applying a first voltage to the confronting electrode; and (b) applying a second voltage to the bit line and a third voltage to the word line to turn ON the transfer transistor when selectively writing new non-volatile information to the memory cell and erasing old non-volatile information stored in the memory cell, said memory cell being capable of storing both non-volatile and volatile information independently of each other so that the volatile information and the non-volatile information are respectively read from the memory cell in response to mutually different bias voltage values.

42. The method as claimed in claim 41, wherein said second voltage is a ground potential which is smaller that said first voltage.

43. The method as claimed in claim 41, wherein said first voltage is a ground potential which is smaller that said second voltage.

* * * * *

UNITED STATES PATENT AND TRADEMARK OFFICE
CERTIFICATE OF CORRECTION

PATENT NO. : 5,641,979
DATED : June 24, 1997
INVENTOR(S) : EMA et al.

It is certified that error appears in the above-identified patent and that said Letters Patent is hereby corrected as shown below:

TITLE PAGE: [75] Inventors, second line, change "Inagi" to --Tokyo--.

Col. 7, line 60, change "BL + H" to --$BL_{+H}$--.

Col. 20, line 40, change "hole" to --hold--.

Col. 21, line 47, change "for example" to --, for example,--.

Col. 23, line 52, change "21 and 21" to --21A and 21B--.

Col. 30, line 57 (Claim 35, line 3), change "that" to --than--.

Col. 34, line 2 (Claim 42, line 2), change "that" to --than--;
line 5 (Claim 43, line 2), change "that" to --than--.

Signed and Sealed this

Thirteenth Day of January, 1998

Attest:

Attesting Officer

BRUCE LEHMAN

Commissioner of Patents and Trademarks